US012749448B2

(12) United States Patent
Son et al.

(10) Patent No.: US 12,749,448 B2
(45) Date of Patent: Sep. 29, 2026

(54) DISPLAY DEVICE AND ELECTRONIC DEVICE INCLUDING THE SAME

(71) Applicant: Samsung Display Co., LTD., Yongin-si (KR)

(72) Inventors: Sunkwun Son, Yongin-si (KR); Cheol-Gon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 19/198,407

(22) Filed: May 5, 2025

(65) Prior Publication Data

US 2026/0031038 A1 Jan. 29, 2026

(30) Foreign Application Priority Data

Jul. 25, 2024 (KR) ........................ 10-2024-0098695
Mar. 7, 2025 (KR) ........................ 10-2025-0030161

(51) Int. Cl.
*G09G 3/3233* (2016.01)
*H10K 59/121* (2023.01)
*G09G 3/34* (2006.01)

(52) U.S. Cl.
CPC ....... *G09G 3/3233* (2013.01); *H10K 59/1213* (2023.02); *G09G 3/344* (2013.01); *G09G 2300/0426* (2013.01); *G09G 2300/0819* (2013.01); *G09G 2300/0852* (2013.01); *G09G 2354/00* (2013.01)

(58) Field of Classification Search
None
See application file for complete search history.

(56) References Cited

U.S. PATENT DOCUMENTS

2022/0367598 A1 11/2022 Cho et al.
2023/0105490 A1 4/2023 Park et al.
2023/0200137 A1 6/2023 Kang et al.
2023/0343289 A1 * 10/2023 Song .................. G06V 40/1318
2023/0397467 A1 12/2023 Lim et al.

OTHER PUBLICATIONS

Extended European Search Report dated Nov. 17, 2025 from the European Patent Office for European Patent Application No. 25190090.8, 15 pages.

* cited by examiner

*Primary Examiner* — Carl Adams
(74) *Attorney, Agent, or Firm* — CANTOR COLBURN LLP

(57) ABSTRACT

A display device includes a light emitting element, a first transistor which applies a driving current to the light emitting element, a first capacitor including a first electrode connected to a gate electrode of the first transistor and a second electrode, a second transistor which applies a data voltage to the second electrode of the first capacitor in response to a write gate signal, a third transistor which diode-connects the first transistor in response to a compensation gate signal, and a fourth transistor which applies an initialization voltage to an anode of the light emitting element in response to an initialization gate signal. A channel of the first transistor and a channel of the third transistor are in a first semiconductor layer. A channel of the second transistor and a channel of the fourth transistor are in a second semiconductor layer arranged on the first semiconductor layer.

20 Claims, 35 Drawing Sheets

DISPLAY DEVICE AND ELECTRONIC DEVICE INCLUDING THE SAME

This application claims priority to Korean Patent Application No. 10-2024-0098695, filed on Jul. 25, 2024, and Korean Patent Application No. 10-2025-0030161, filed on Mar. 7, 2025, all the benefits accruing therefrom under 35 U.S.C. § 119, the contents of which in their entireties are herein incorporated by reference.

BACKGROUND

1. Field

Embodiments relate to a display device and an electronic device including the display device. More particularly, embodiments relate to a high-resolution display device and an electronic device including the display device.

2. Description of the Related Art

A display device is a device that displays an image to provide visual information to a user. Types of display device include a liquid crystal display, an organic light emitting diode display, or the like. The display device may be operated by thin film transistors, capacitors, and multiple lines which have complex interconnections.

Recently, as a demand for compact and high-resolution display device increases, a demand for efficient space arrangement, connection structure, driving method, and improvement of quality of images implemented among thin film transistors, capacitors, and lines included in the display device is increasing.

SUMMARY

Embodiments provide a display device with improved resolution.

Embodiments also provide an electronic device including a display device with improved resolution.

A display device according to an embodiment includes a light emitting element, a first transistor which applies a driving current to the light emitting element, a first capacitor including a first electrode electrically connected to a gate electrode of the first transistor and a second electrode, a second transistor which applies a data voltage to the second electrode of the first capacitor in response to a write gate signal, a third transistor which diode-connects the first transistor in response to a compensation gate signal, and a fourth transistor which applies an initialization voltage to an anode of the light emitting element in response to an initialization gate signal. In such an embodiment, a channel of the first transistor and a channel of the third transistor are in a first semiconductor layer, and a channel of the second transistor and a channel of the fourth transistor are in a second semiconductor layer arranged on the first semiconductor layer.

In an embodiment, the first semiconductor layer may include a silicon semiconductor, and the second semiconductor layer may include an oxide semiconductor.

In an embodiment, the first semiconductor layer may include a first semiconductor pattern including a first source region, a first drain region, a first channel region between the first source region and the first drain region, a third source region connected to the first drain region, a third drain region, and a third channel region between the third source region and the third drain region. In such an embodiment, the first channel region may be the channel of the first transistor, and the third channel region may be the channel of the third transistor.

In an embodiment, the second semiconductor layer may include a second semiconductor pattern including a second source region, a second drain region, and a second channel region between the second source region and the second drain region, and a third semiconductor pattern spaced apart from the second semiconductor pattern and including a fourth source region, a fourth drain region, and a fourth channel region between the fourth source region and the fourth drain region. In such an embodiment, the second channel region may be the channel of the second transistor, and the fourth channel region may be the channel of the fourth transistor.

In an embodiment, the first capacitor may at least partially overlap each of the channel of the second transistor and the channel of the third transistor in a plan view.

In an embodiment, the display device may further include a second capacitor including a first electrode electrically connected to the second transistor and the second electrode of the first capacitor and a second electrode which receives the initialization voltage.

In an embodiment, the second capacitor may at least partially overlap the first capacitor in a plan view.

In an embodiment, the second capacitor may at least partially overlap each of the channel of the second transistor and the channel of the third transistor in a plan view.

In an embodiment, the first capacitor may be arranged between the first semiconductor layer and the second semiconductor layer, and the second capacitor may be arranged on the second semiconductor layer.

In an embodiment, the first transistor may include the gate electrode, a first electrode which receives a power voltage, and a second electrode electrically connected to the light emitting element. In such an embodiment, the display device may further include a power line which applies the power voltage to the first electrode of the first transistor. In such an embodiment, the power supply line may be in a first conductive layer arranged below the first semiconductor layer.

In an embodiment, the third transistor may include a gate electrode which receive the compensation gate signal, a first electrode electrically connected to the second electrode of the first transistor, and a second electrode electrically connected to the gate electrode of the first transistor. In such an embodiment, the display device may further include a first connection pattern electrically connected to the first electrode of the first transistor and the power line. In such an embodiment, the gate electrode of the first transistor and the gate electrode of the third transistor may be in a second conductive layer arranged between the first semiconductor layer and the second semiconductor layer. In such an embodiment, the first connection pattern may be in a third conductive layer arranged between the second conductive layer and the second semiconductor layer.

In an embodiment, the display device may further include a second connection pattern electrically connected to the gate electrode of the first transistor and the second electrode of the third transistor. In such an embodiment, the second connection pattern may be in the third conductive layer.

In an embodiment, the display device may further include a third connection pattern electrically connected to the second electrode of the first transistor and the first electrode of the third transistor. In such an embodiment, the third connection pattern may be in a fourth conductive layer arranged between the third conductive layer and the second semiconductor layer.

In an embodiment, the first electrode of the first capacitor may be electrically connected to the second electrode of the third transistor, and the first electrode of the first capacitor may be in a fifth conductive layer arranged between the third conductive layer and the second semiconductor layer.

In an embodiment, the display device may further include a fourth connection pattern electrically connected to the second electrode of the first transistor and the first electrode of the third transistor. In such an embodiment, the fourth connection pattern may be in the fifth conductive layer.

In an embodiment, the second transistor may include a gate electrode which receives the write gate signal, a first electrode which receives the data voltage, and a second electrode electrically connected to the second electrode of the first capacitor. In such an embodiment, the second electrode of the first capacitor may be electrically connected to the second electrode of the second transistor and the first electrode of the second capacitor, and the second electrode of the first capacitor may be in a sixth conductive layer arranged between the fifth conductive layer and the second semiconductor layer.

In an embodiment, the display device may further include a fifth connection pattern electrically connected to the second electrode of the first transistor and the first electrode of the third transistor, and a sixth connection pattern electrically connected to the second electrode of the first capacitor. In such an embodiment, the fifth connection pattern and the sixth connection pattern may be in a seventh conductive layer arranged between the sixth conductive layer and the second semiconductor layer.

In an embodiment, the fourth transistor may include a gate electrode which receives the initialization gate signal, a first electrode which receives the initialization voltage, and a second electrode electrically connected to the light emitting element. In such an embodiment, the gate electrode of the second transistor and the gate electrode of the fourth transistor may be in an eighth conductive layer arranged on the second semiconductor layer. In such an embodiment, the first electrode of the second capacitor may be electrically connected to the second electrode of the second transistor and the second electrode of the first capacitor, and the first electrode of the second capacitor may be in a ninth conductive layer arranged on the eighth conductive layer.

In an embodiment, the display device may further include a seventh connection pattern electrically connected to the second electrode of the first transistor and the first electrode of the third transistor. In such an embodiment, the seventh connection pattern may be in the ninth conductive layer.

An electronic device according to an embodiment includes a housing and a display device accommodated in the housing, where the display device displays an image. In such an embodiment, the display device includes a light emitting element, a first transistor which applies a driving current to the light emitting element, a first capacitor including a first electrode electrically connected to a gate electrode of the first transistor and a second electrode, a second transistor which applies a data voltage to the second electrode of the first capacitor in response to a write gate signal, a third transistor which diode-connects the first transistor in response to a compensation gate signal, and a fourth transistor which applies an initialization voltage to an anode of the light emitting element in response to an initialization gate signal. In such an embodiment, a channel of the first transistor and a channel of the third transistor are in a first semiconductor layer, and a channel of the second transistor and a channel of the fourth transistor are in a second semiconductor layer arranged on the first semiconductor layer.

According to embodiments, a resolution of the display device may be further improved.

BRIEF DESCRIPTION OF THE DRAWINGS

The above and other features of embodiments of the invention will become more apparent by describing in further detail embodiments thereof with reference to the accompanying drawings, in which.

DETAILED DESCRIPTION

Figure 1:
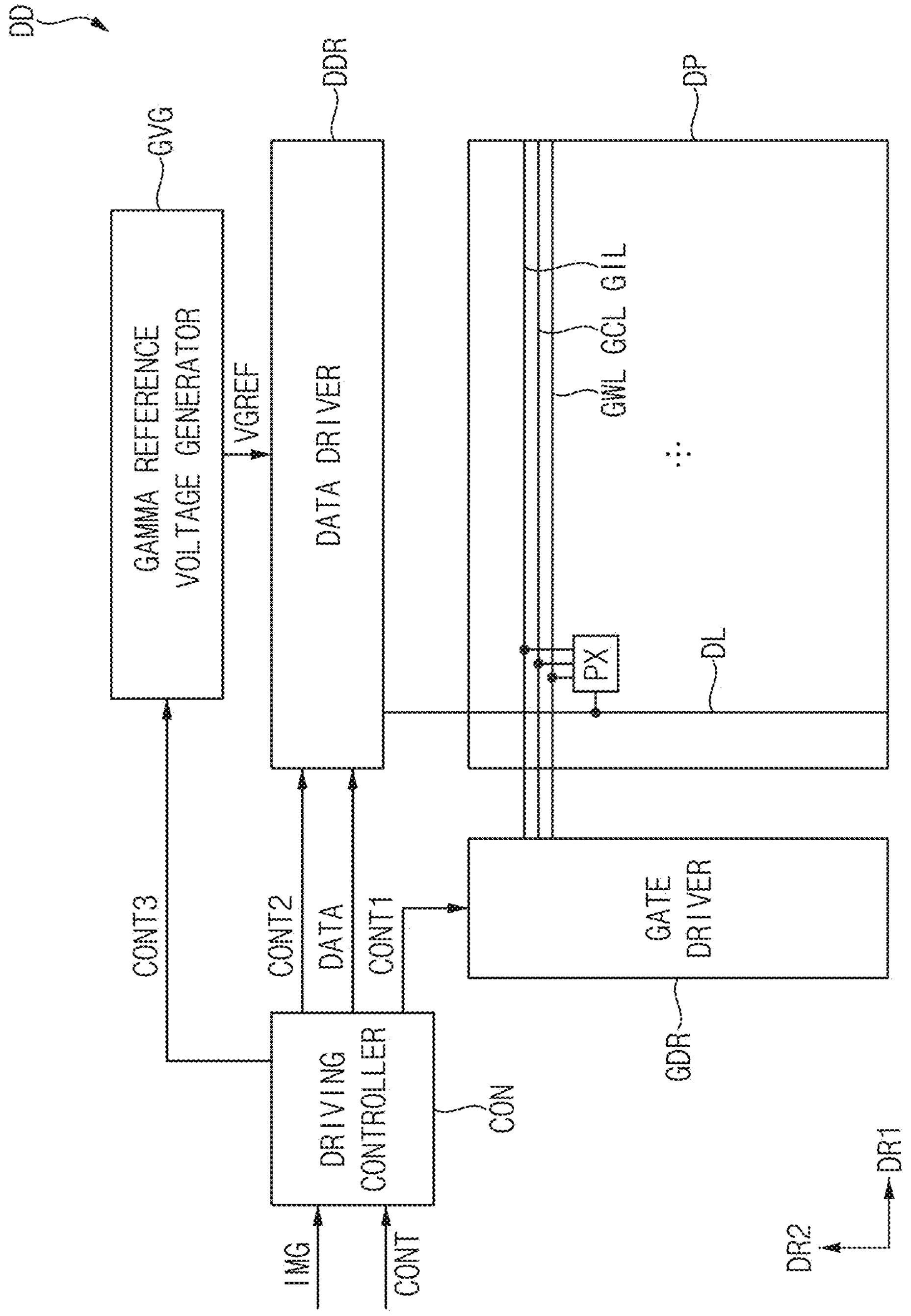
FIG. 1 is a block diagram illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

In the disclosure, various modifications can be made, various forms can be used, and specific embodiments will be illustrated in the drawings and described in detail in the text. However, this is not intended to limit the disclosure to a specific form disclosed, and it will be understood that all changes, equivalents, or substitutes which fall in the spirit and technical scope of the disclosure should be included.

It will be understood that, although the terms first, second, third etc. may be used herein to describe various elements, these elements should not be limited by these terms. These terms are used to distinguish one element from another. Thus, a first element discussed below could be termed a second element without departing from the teachings herein.

It will be understood that when an element is referred to as being "connected" or "coupled" to another element, it can be directly connected or coupled to the other element or intervening element(s) may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting. As used herein, the singular forms "a," "an" and "the" are intended to include the plural forms as well, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings. The same reference numerals are used for the same components in the drawings, and any repetitive detailed descriptions of the same components will be omitted or simplified.

FIG. 1 is a block diagram illustrating a display device according to an embodiment.

Referring to FIG. 1, a display device DD according to an embodiment may include a display panel DP and a panel driver for driving the display panel DP. The panel driver may include a driving controller CON, a gate driver GDR, a gamma reference voltage generator GVG, and a data driver DDR.

In an embodiment, for example, the drive controller CON and the data driver DDR may be integrally formed with each other (e.g., as a single driver, module, or chip). In an embodiment, for example, the drive controller CON, the gamma reference voltage generator GVG, and the data driver DDR may be integrally formed each other. In an embodiment, for example, the drive controller CON, the gate driver GDR, the gamma reference voltage generator GVG, and the data driver DDR may be integrally formed each other. A driving module including at least the driving controller CON and the data driver DDR which are integrally formed may be referred to as a timing controller embedded data driver (TED).

The display panel DP may include a display portion, in which an image is displayed, and a peripheral portion arranged adjacent to the display portion.

In an embodiment, for example, the display panel DP may be an organic light emitting diode display panel including organic light emitting diodes. In an embodiment, for example, the display panel DP may be a quantum-dot organic light emitting diode display panel including organic light emitting diodes and quantum-dot color filters. In an embodiment, for example, the display panel DP may be a quantum-dot nano light emitting diode display panel including nano light emitting diodes and quantum-dot color filters.

The display panel DP may include gate lines GWL, GCL, and GIL, data lines DL, and pixels PX. The pixels PX may be electrically connected to the gate lines GWL, GCL, and GIL and the data lines DL. In an embodiment, for example, each of the gate lines GWL, GCL, and GIL may generally extend in a first direction DR1. Each of the data lines DL may generally extend in a second direction DR2 crossing the first direction DR1.

The driving controller CON may receive an input image data IMG and an input control signal CONT from an external device. In an embodiment, for example, the input image data IMG may include red image data, green image data, and blue image data. The input image data IMG may further include white image data. Alternatively, the input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller CON may generate a first control signal CONT1, a second control signal CONT2, a third control signal CONT3, and a data signal DATA based on the input image data IMG and the input control signal CONT.

The driving controller CON may generate the first control signal CONT1 for controlling an operation of the gate driver GDR based on the input control signal CONT. The driving controller CON may output the first control signal CONT1 to the gate driver GDR. The first control signal CONT1 may include a vertical start signal and a gate clock signal.

The driving controller CON may generate the second control signal CONT2 for controlling an operation of the data driver DDR based on the input control signal CONT. The driving controller CON may output the second control signal CONT2 to the data driver DDR. The second control signal CONT2 may include a horizontal start signal and a load signal.

The driving controller CON may generates the data signal DATA based on the input image data IMG. The driving controller CON may output the data signal DATA to the data driver DDR.

The driving controller CON may generate the third control signal CONT3 for controlling an operation of the gamma reference voltage generator GVG based on the input control signal CONT. The driving controller CON may output the third control signal CONT3 to the gamma reference voltage generator GVG.

The gate driver GDR may generate gate signals in response to the first control signal CONT1 received from the driving controller CON. The gate driver GDR may output the gate signals to the gate lines GWL, GIL, and GBL.

In an embodiment, the gate driver GDR may be integrated on the peripheral portion of the display panel DP.

The gamma reference voltage generator GVG may generate a gamma reference voltage VGREF in response to the third control signal CONT3 received from the driving controller CON. The gamma reference voltage generator GVG may provide the gamma reference voltage VGREF to the data driver DDR. The gamma reference voltage VGREF may have a value corresponding to each data signal DATA.

In an embodiment, the gamma reference voltage generator GVG may be arranged (e.g., integrated) in the driving controller CON or in the data driver DDR.

The data driver DDR may receive the second control signal CONT2 and the data signal DATA from the driving controller CON, and may receive the gamma reference voltage VGREF from the gamma reference voltage generator GVG. The data driver DDR may convert the data signal DATA into a data voltage in analog form using the gamma reference voltage VGREF. The data driver DDR may output the data voltage to the data line DL.

Figure 2:
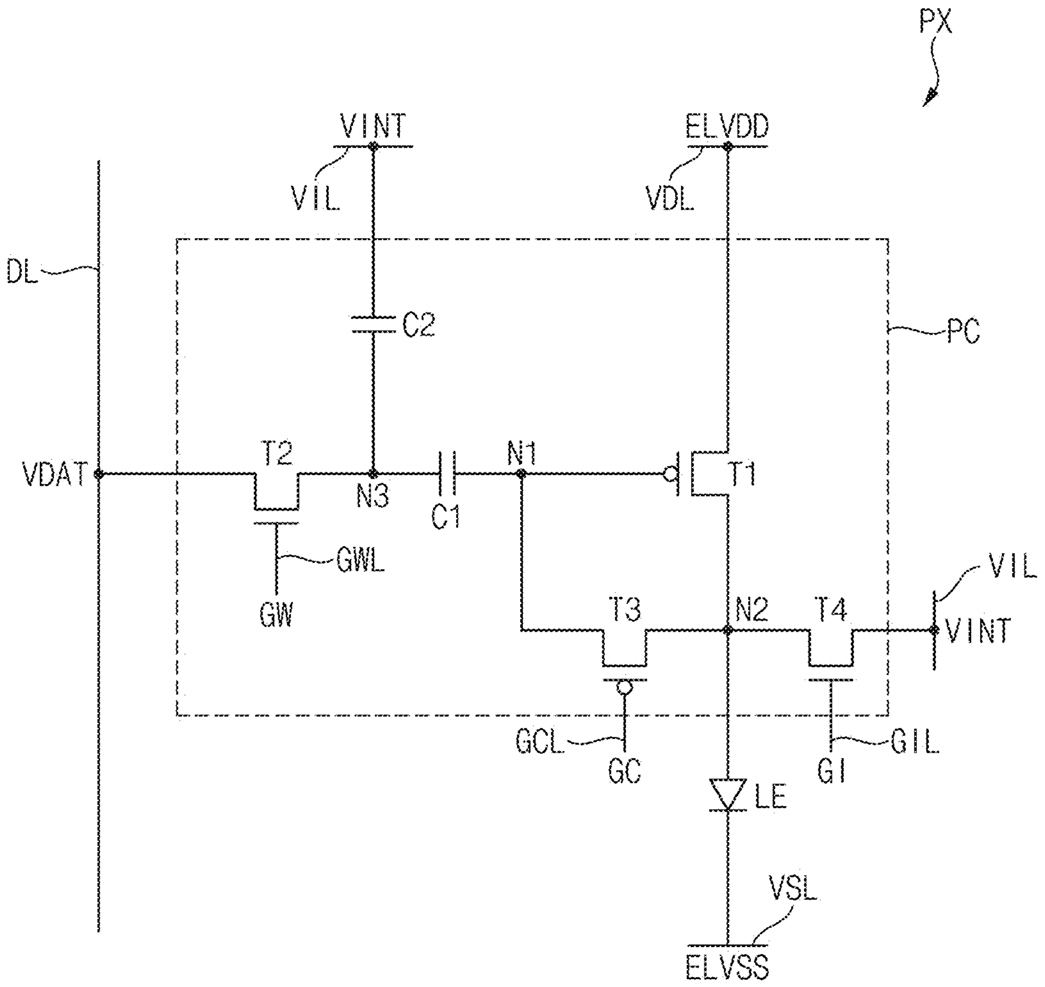
FIG. 2 is an equivalent circuit diagram illustrating an example of a pixel included in the display device of FIG. 1.

FIG. 2 is an equivalent circuit diagram illustrating an example of a pixel included in the display device of FIG. 1.

Referring to FIGS. 1 and 2, in an embodiment, the display panel DP may include the pixels PX arranged in the display portion. In an embodiment, for example, each of the pixels PX may emit one of red light, green light, and blue light, but embodiments are not limited thereto. The light emitted from the pixels PX may be combined to generate the image. In an embodiment, for example, a plurality of pixels PX that emit light of different colors and are adjacent to each other may form one unit pixel.

Each of the pixels PX may include a pixel circuit PC and a light emitting element LE. The pixel circuit PC may include at least one thin film transistor and at least one capacitor. In an embodiment, the pixel circuit PC may include a first transistor T1, a second transistor T2, a third transistor T3, a fourth transistor T4, a first capacitor C1, and a second capacitor C2.

The first transistor T1 may include a gate electrode connected to a first node N1, a first electrode (e.g., a source) connected to a first power line VDL to receive a first power voltage ELVDD, and a second electrode (e.g., a drain) connected to a second node N2. The first power voltage ELVDD may be a high power voltage. The first transistor T1 may generate a driving current based on to a voltage of the gate electrode (i.e., the first node N1) of the first transistor T1, and may apply the driving current to the light emitting element LE. The first transistor T1 may be referred to as a driving transistor. In an embodiment, the first transistor T1 may be a p-channel metal-oxide-semiconductor (PMOS) transistor, but embodiments are not limited thereto.

The second transistor T2 may include a gate electrode connected to a write gate line GWL to receive a write gate signal GW, a first electrode (e.g., a source) connected to the data line DL to receive the data voltage VDAT, and a second electrode (e.g., a drain) connected to a third node N3. When the second transistor T2 is turned on in response to the write gate signal GW, the data voltage VDAT applied through the data line DL may be stored in the first capacitor C1. The second transistor T2 may be referred to as a write transistor. In an embodiment, the second transistor T2 may be an n-channel metal-oxide-semiconductor (NMOS) transistor, but embodiments are not limited thereto.

The first capacitor C1 may include a first electrode connected to the first node N1 and a second electrode connected to the third node N3. The first capacitor C1 may serve to receive the data voltage VDAT from the second transistor T2, to transfer the data voltage VDAT as a voltage of the gate electrode of the first transistor T1, and to maintain the voltage of the gate electrode. The first capacitor C1 may be referred to as a storage capacitor.

The second capacitor C2 may include a first electrode connected to the third node N3 and a second electrode connected to an initialization line VIL to receive an initialization voltage VINT. The second capacitor C2 may serve to hold a voltage of the third node N3 constant, preventing the voltage of the third node N3 from changing even when the surrounding signal changes. The second capacitor C2 may be referred to as a hold capacitor.

The third transistor T3 may include a gate electrode connected to a compensation gate line GCL to receive a compensation gate signal GC, a first electrode (e.g., a source) connected to the second node N2, and a second electrode (e.g., a drain) connected to the first node N1. When the third transistor T3 is turned on in response to the compensation gate signal GC, the first transistor T1 may be diode-connected. That is, the third transistor T3 may form a compensation path that compensates for a threshold voltage of the first transistor T1 so that the threshold voltage of the first transistor T1 may be stored in the first electrode of the first capacitor C1 to be compensated. The third transistor T3 may be referred to as a compensation transistor. In an embodiment, the third transistor T3 may be a PMOS transistor, but embodiments are not limited thereto.

The fourth transistor T4 may include a gate electrode connected to an initialization gate line GIL to receive an initialization gate signal GI, a first electrode (e.g., a source) connected to the initialization line VIL to receive the initialization voltage VINT, and a second electrode (e.g., a drain) connected to the second node N2. When the fourth transistor T4 is turned on in response to the initialization gate signal GI, the initialization voltage VINT may be applied to a first electrode (e.g., an anode) of the light emitting element LE. The fourth transistor T4 may serve to initialize the first electrode of the light emitting element LE. The fourth transistor T4 may be referred to as an initialization transistor. In an embodiment, the fourth transistor T4 may be an NMOS transistor, but embodiments are not limited thereto.

The light emitting element LE may include the first electrode (e.g., the anode) connected to the second node N2 and a second electrode (e.g., a cathode) connected to a second power line VSL to receive a second power voltage ELVSS. The second power voltage ELVSS may be a low power voltage. The light emitting element LE may emit light with a brightness corresponding to the driving current applied from the first transistor T1.

Figure 3:
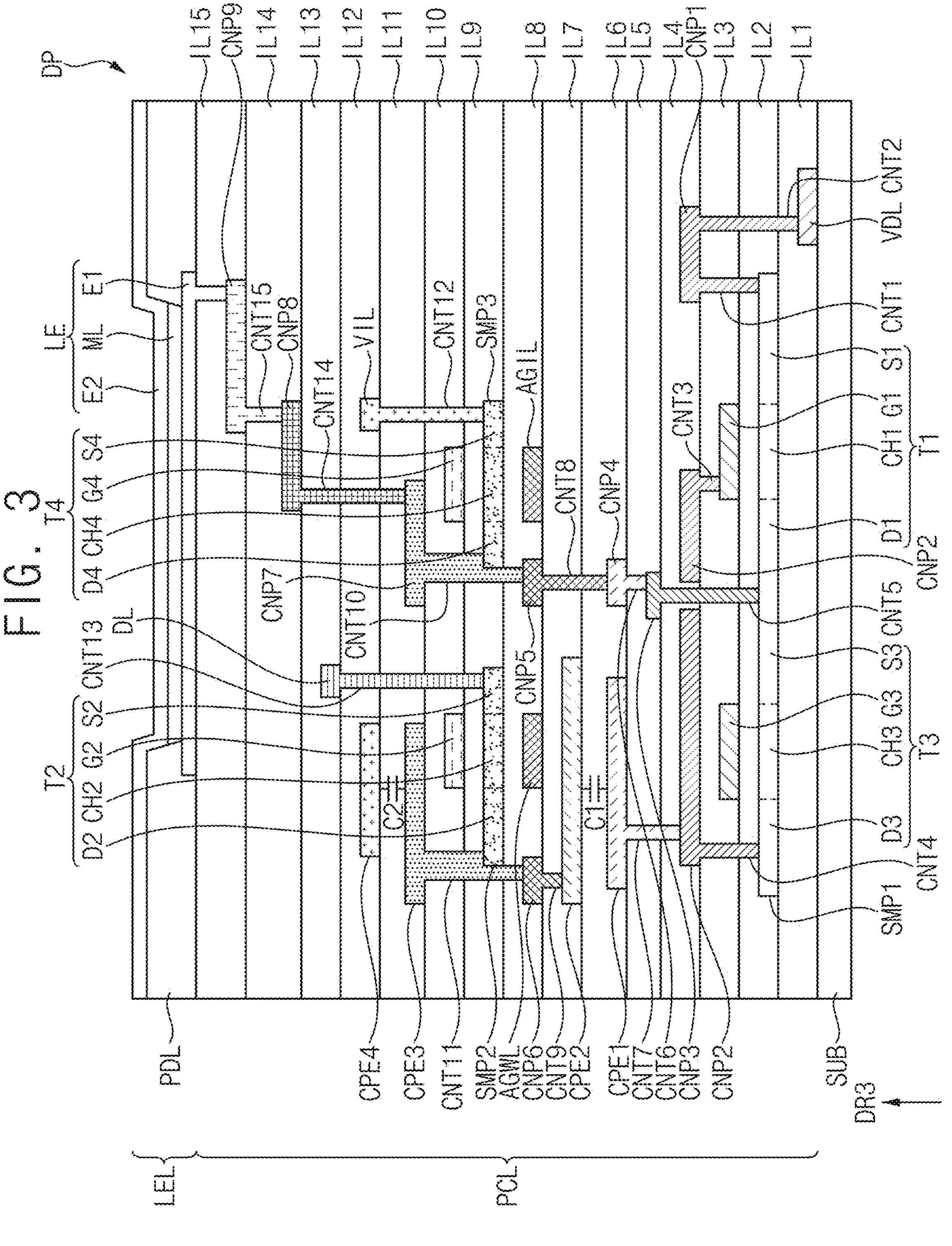
FIG. 3 is a cross-sectional view illustrating an example of a display panel included in the display device of FIG. 1.

FIG. 3 is a cross-sectional view illustrating an example of a display panel included in the display device of FIG. 1. FIGS. 4 to 32 are plan views illustrating layers of the display panel of FIG. 3.

FIG. 3 is a cross-sectional view schematically illustrating one pixel PX described with reference to FIG. 2. FIGS. 4 to 32 are plan views of layers constituting the pixel PX of FIG. 3. FIGS. 4 to 32 selectively illustrate some of the layers among the plurality of layers included in the display panel DP.

Hereinafter, an example of an arrangement structure of the transistors, the capacitors, and the lines included in the pixel circuit PC of FIG. 2 will be described in greater detail with reference to FIGS. 3 to 32. The arrangement structure of one pixel circuit PC described with reference to FIGS. 3 to 32 may be repeatedly provided in the display panel DP.

Referring to FIGS. 3 to 32, an embodiment of the display panel DP may include a substrate SUB, a circuit element layer PCL, and a light emitting element layer LEL. The pixel circuit PC of FIG. 2 may be arranged in the circuit element layer PCL, and the light emitting element LE of FIG. 2 and a pixel defining layer PDL may be arranged in the light emitting element layer LEL. The circuit element layer PCL and the light emitting element layer LEL may be sequentially arranged on the substrate SUB along a third direction DR3. The third direction DR3 may cross the first direction DR1 and the second direction DR2 or may be a thickness direction of the substrate SUB. Hereinafter, the third direction DR3 may be referred to as an upper direction.

In an embodiment, the circuit element layer PCL may include a first conductive layer CL1, a first insulating layer IL1, a first semiconductor layer SML1, a second insulating layer IL2, a second conductive layer CL2, a third insulating layer IL3, a third conductive layer CL3, a fourth insulating layer IL4, a fourth conductive layer CL4, a fifth insulating layer IL5, a fifth conductive layer CL5, a sixth insulating layer IL6, a sixth conductive layer CL6, a seventh insulating layer IL7, a seventh conductive layer CL7, an eighth insulating layer IL8, a second semiconductor layer SML2, a ninth insulating layer IL9, an eighth conductive layer CL8, a tenth insulating layer IL10, a ninth conductive layer CL9, an eleventh insulating layer IL11, a tenth conductive layer CL10, a twelfth insulating layer IL12, an eleventh conductive layer CL11, a thirteenth insulating layer IL13, a twelfth conductive layer CL12, a fourteenth insulating layer IL14, a thirteenth conductive layer CL13, and a fifteenth insulating layer IL15 sequentially arranged or stacked along the third direction DR3.

The substrate SUB may be an insulating substrate including or formed of a transparent or opaque material. In an embodiment, for example, the substrate SUB may include glass. In this case, the display panel DP may be a rigid display panel. In an embodiment, for example, the substrate SUB may include plastic. In such an embodiment, the display panel DP may be a flexible display panel.

Figure 4:
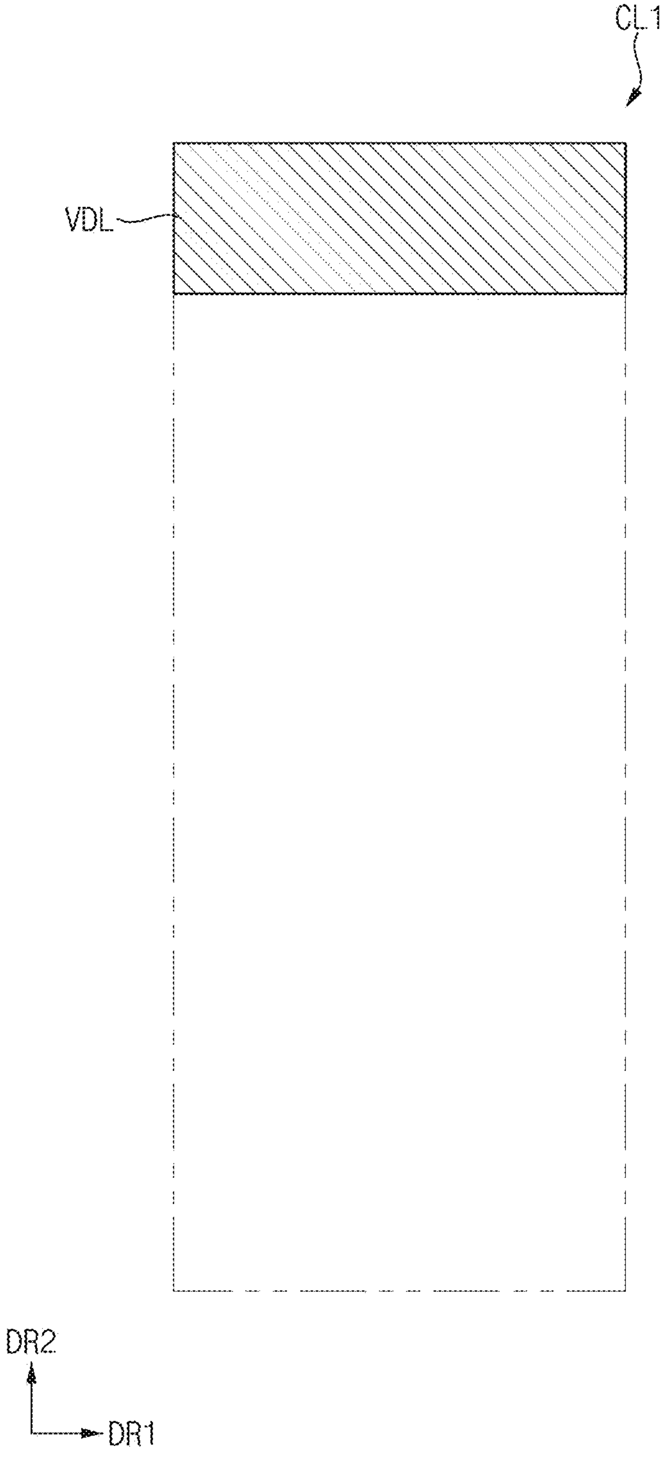
FIGS. 4 to 32 are plan views illustrating layers of the display panel of FIG. 3.

FIG. 4 illustrates the first conductive layer CL1.

In an embodiment, as illustrated in FIGS. 3 and 4, the first conductive layer CL1 may be arranged on the substrate SUB. The first conductive layer CL1 may include a conductive material, such as a metal, an alloy, a conductive metal nitride, a conductive metal oxide, a transparent conductive material, or the like. In an embodiment, for example, the first conductive layer CL1 may include a low-resistance metal material, such as copper (Cu), aluminum (Al), molybdenum (Mo), titanium (Ti), or the like, but embodiments are not limited thereto. The first conductive layer CL1 may have a single-layer structure or a multi-layer structure including a plurality of conductive layers. In an embodiment, the first conductive layer CL1 may be referred to as a lower conductive layer.

The first conductive layer CL1 may include or define the first power line VDL. In an embodiment, the first power line VDL may extend in the first direction DR1. The first power voltage ELVDD may be applied to the first power line VDL.

In an embodiment, a buffer layer may be arranged between the substrate SUB and the first conductive layer CL1. The buffer layer may prevent or reduce impurities, such as oxygen or moisture, from diffusing into the first conductive layer CL1 through the substrate SUB. The buffer layer may include an inorganic insulating material, such as a silicon compound, a metal oxide, or the like. The buffer layer may have a single-layer structure or a multi-layer structure including a plurality of insulating layers. In an embodiment, the buffer layer may be omitted.

The first insulating layer IL1 may be arranged on the first conductive layer CL1. The first insulating layer IL1 may include an inorganic insulating material and/or an organic insulating material. The first insulating layer IL1 may have a single-layer structure or a multi-layer structure including a plurality of insulating layers. The first insulating layer IL1 may cover the first power line VDL.

Figure 5:
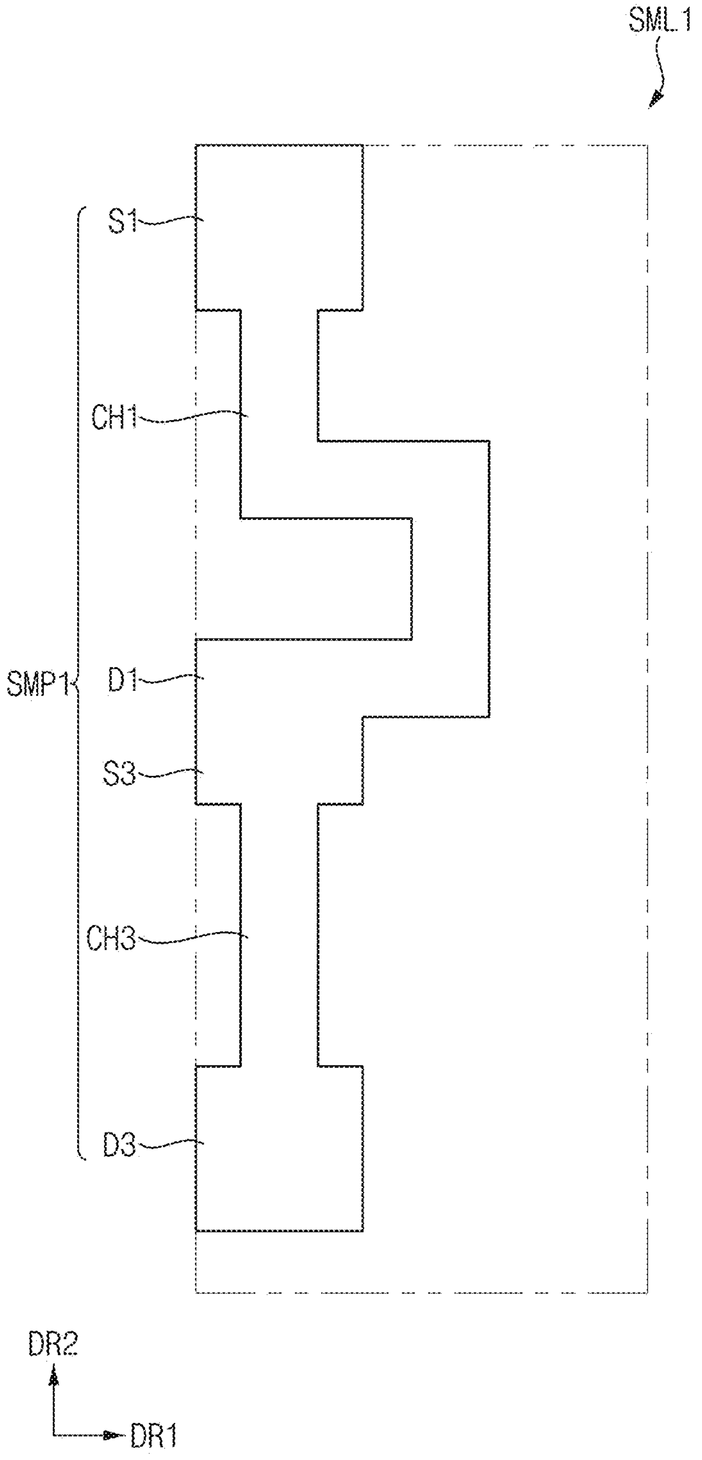
Figure 6:
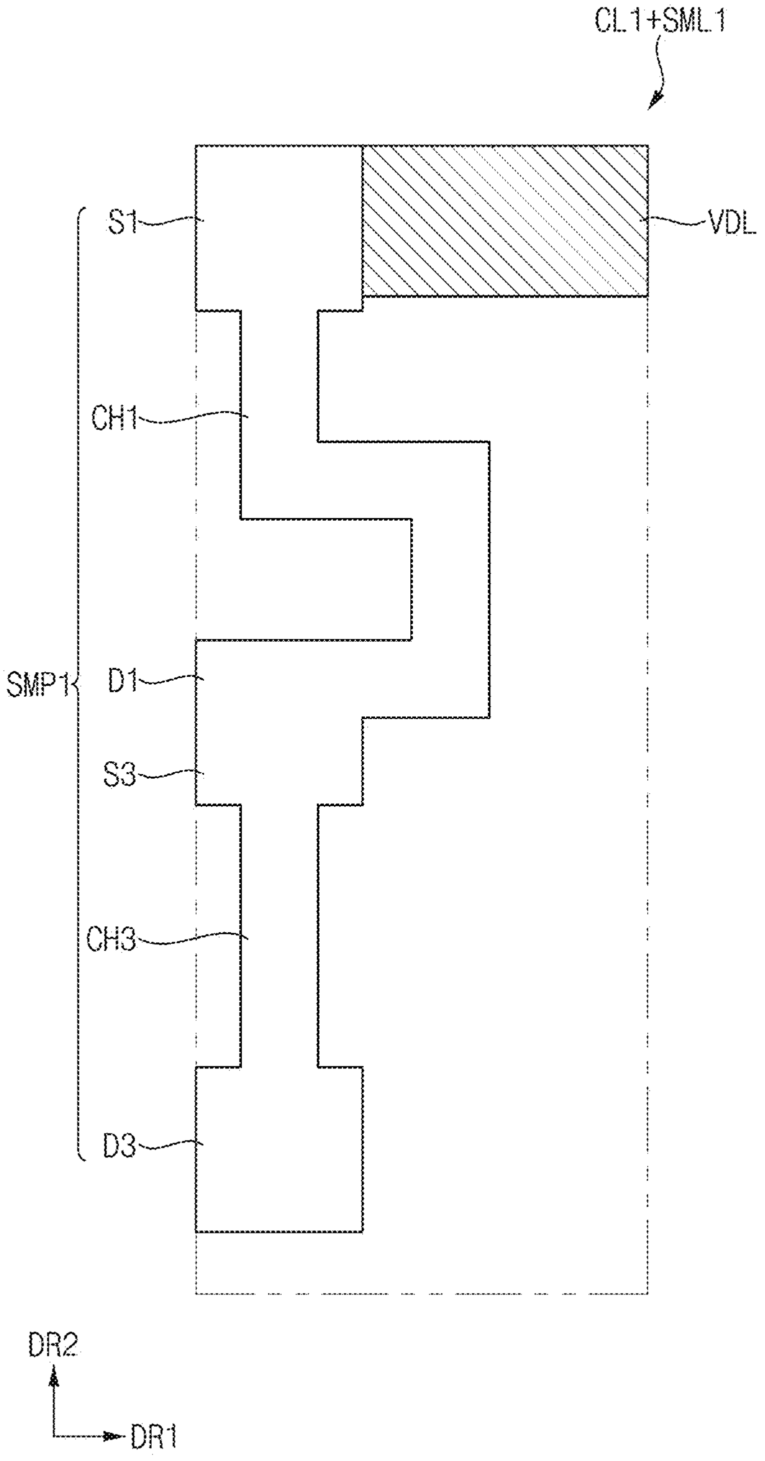

FIG. 5 illustrates the first semiconductor layer SML1, and FIG. 6 illustrates the view of FIG. 4 with the first semiconductor layer SML1 further arranged.

In an embodiment, as illustrated in FIGS. 3, 5, and 6, the first semiconductor layer SML1 may be arranged on the first insulating layer IL1. That is, the first conductive layer CL1 may be arranged below the first semiconductor layer SML1.

In an embodiment, the first semiconductor layer SML1 may include a silicon semiconductor. In an embodiment, for example, the first semiconductor layer SML1 may include polycrystalline silicon, amorphous silicon, or the like. In an embodiment, for example, the first semiconductor layer SML1 may include low-temperature polysilicon.

The first semiconductor layer SML1 may include or define a first semiconductor pattern SMP1. The first semiconductor pattern SMP1 may be integrally provided. The first semiconductor pattern SMP1 may include a first source region S1, a first channel region CH1, a first drain region D1, a third source region S3, a third channel region CH3, and a third drain region D3. The first channel region CH1 may be defined between the first source region S1 and the first drain region D1, and the third channel region CH3 may be defined between the third source region S3 and the third drain region D3. The first drain region D1 and the third drain region D3 may be connected to each other. In an embodiment, the third channel region CH3 may be located in a direction opposite to the second direction DR2 from the first channel region CH1. In an embodiment, the first source region S1, the first drain region D1, the third source region S3, and the third drain region D3 may be sequentially arranged along the direction opposite to the second direction DR2.

In an embodiment, as illustrated in FIG. 5, a length of the first channel region CH1 may be greater than a length of the third channel region CH3. In an embodiment, for example, in a plan view (or when viewed in the third direction DR3), the first channel region CH1 may have a shape that is bent along the first direction DR1 and the second direction DR2, and the third channel region CH3 may have a shape that extends in a straight line along the second direction DR2, but embodiments are not limited thereto.

Electrical properties of the first semiconductor pattern SMP1 may vary depending on whether a region thereof is doped or not. In an embodiment, the first source region S1, the first drain region D1, the third source region S3, and the third drain region D3 may be doped with a P-type dopant, but embodiments are not limited thereto.

The first source region S1 may be the first electrode of the first transistor T1, the first drain region D1 may be the second electrode of the first transistor T1, and the first channel region CH1 may be a channel of the first transistor T1. In an embodiment, as illustrated in FIGS. 4 and 6, the first source region S1 may overlap the first power line VDL in a plan view.

The third source region S3 may be the first electrode of the third transistor T3, the third drain region D3 may be the second electrode of the third transistor T3, and the third channel region CH3 may be a channel of the third transistor T3.

The second insulating layer IL2 may be arranged on the first semiconductor layer SML1. The second insulating layer IL2 may include an inorganic insulating material and/or an organic insulating material. The second insulating layer IL2 may have a single-layer structure or a multi-layer structure including a plurality of insulating layers. The second insulating layer IL2 may cover the first semiconductor pattern SMP1.

Figure 7:
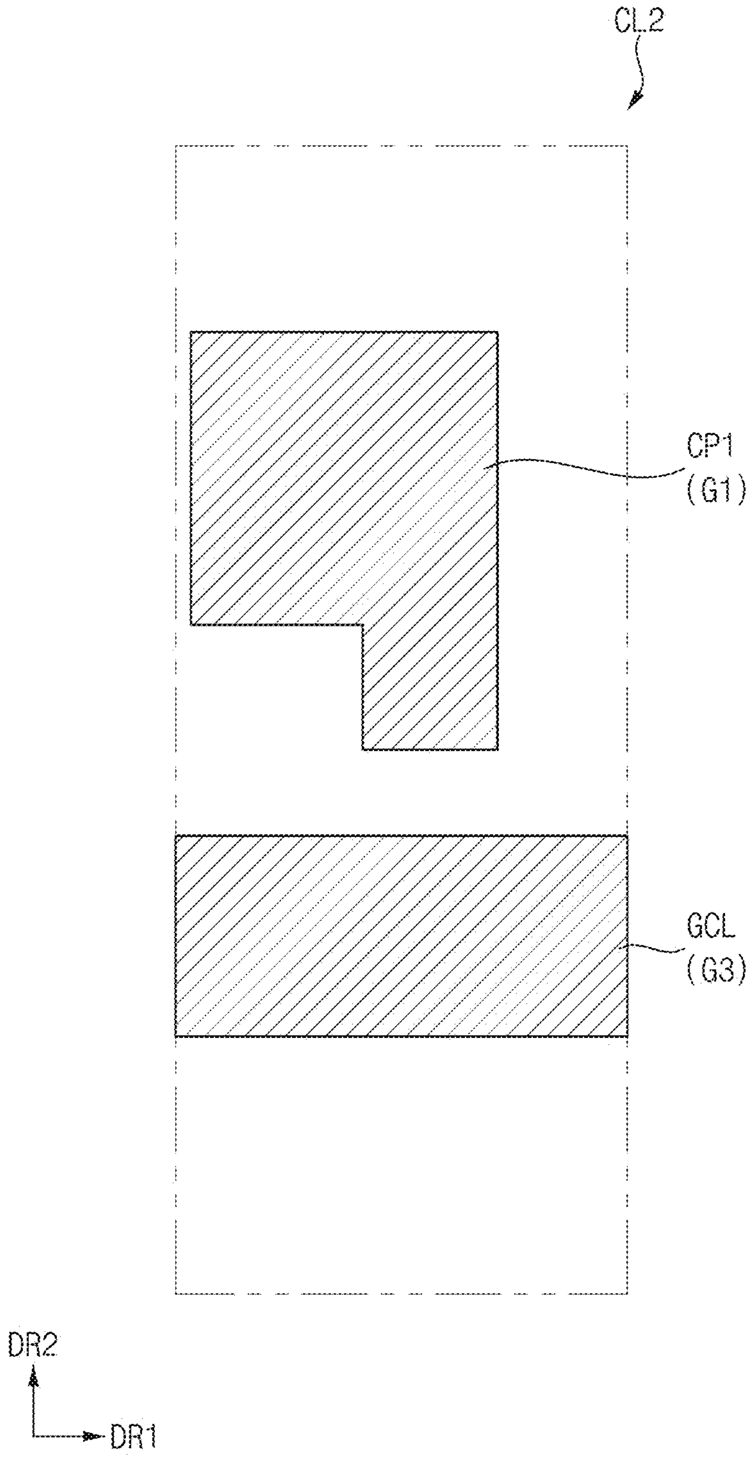
Figure 8:
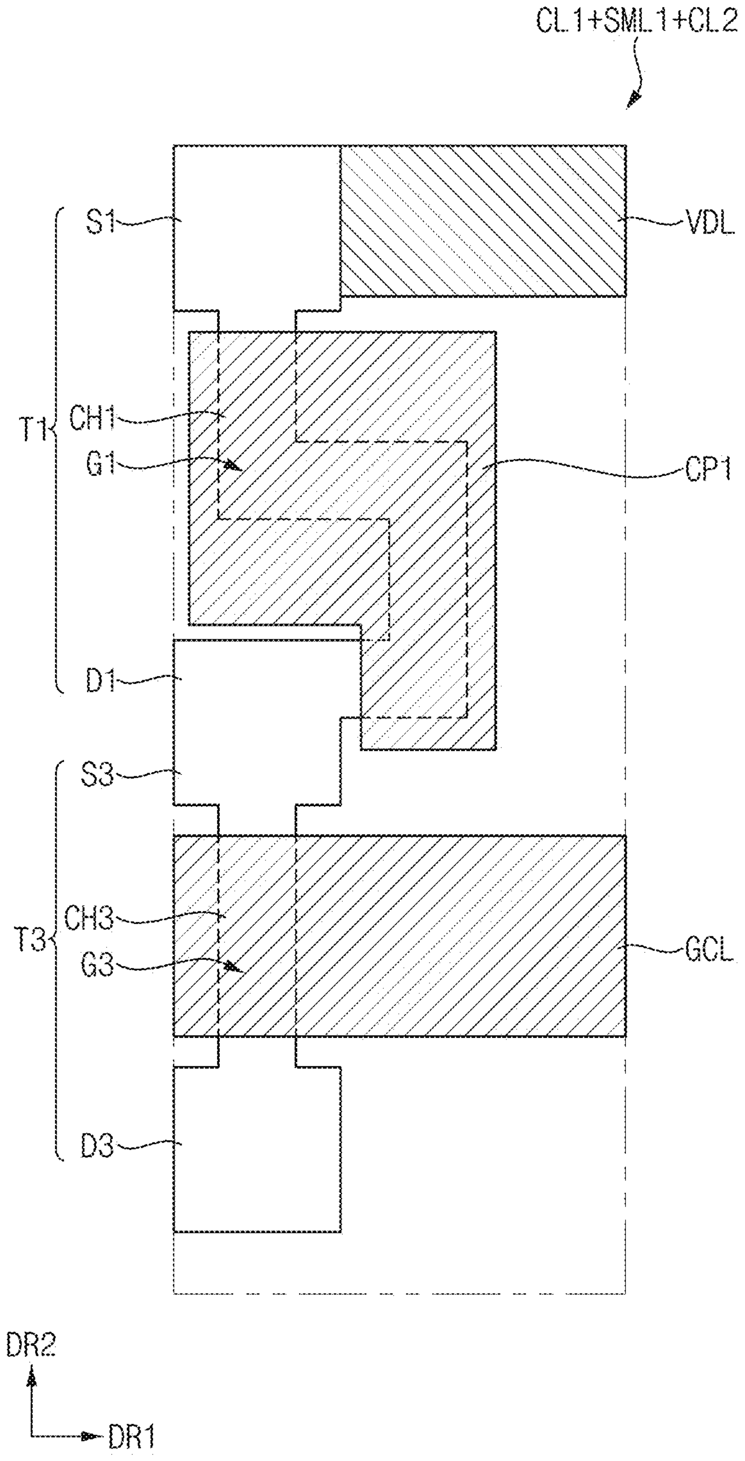

FIG. 7 illustrates the second conductive layer CL2, and FIG. 8 illustrates the view of FIG. 6 with the second conductive layer CL2 further arranged.

In an embodiment, as illustrated in FIGS. 3, 7, and 8, the second conductive layer CL2 may be arranged on the second insulating layer IL2. The second conductive layer CL2 may be arranged on the first semiconductor layer SML1 and below the second semiconductor layer SML2. That is, the second conductive layer CL2 may be arranged between the first semiconductor layer SML1 and the second semiconductor layer SML2. The second conductive layer CL2 may include a conductive material. The second conductive layer CL2 may have a single-layer structure or a multi-layer structure including a plurality of conductive layers. In an embodiment, the second conductive layer CL2 may be referred to as a first gate conductive layer.

The second conductive layer CL2 may include or define a first conductive pattern CP1 and the compensation gate line GCL. The first conductive pattern CP1 and the compensation gate line GCL may be spaced apart from each other in a plan view.

In an embodiment, as illustrated in FIGS. 6 and 8, a portion of the first conductive pattern CP1 may overlap the first channel region CH1 of the first semiconductor pattern SMP1 in a plan view. The portion of the first conductive pattern CP1 overlapping the first channel region CH1 may be the gate electrode G1 of the first transistor T1.

In an embodiment, the first conductive pattern CP1 may be spaced apart from the first power line VDL in the direction opposite to the second direction DR2 in a plan view. That is, the first conductive pattern CP1 may not overlap the first power line VDL in a plan view.

In an embodiment, the compensation gate line GCL may extend in the first direction DR1. The compensation gate line GCL may be spaced apart from the first conductive pattern CP1 in the direction opposite to the second direction DR2 in a plan view. The compensation gate signal GC of FIG. 2 may be applied to the compensation gate line GCL.

A portion of the compensation gate line GCL may overlap the third channel region CH3 of the first semiconductor pattern SMP1 in a plan view. The portion of the compensation gate line GCL overlapping the third channel region CH3 may be the gate electrode G3 of the third transistor T3.

The third insulating layer IL3 may be arranged on the second conductive layer CL2. The third insulating layer IL3 may include an inorganic insulating material and/or an organic insulating material. The third insulating layer IL3 may have a single-layer structure or a multi-layer structure including a plurality of insulating layers. The third insulating layer IL3 may cover the first conductive pattern CP1 and the compensation gate line GCL.

Figure 9:
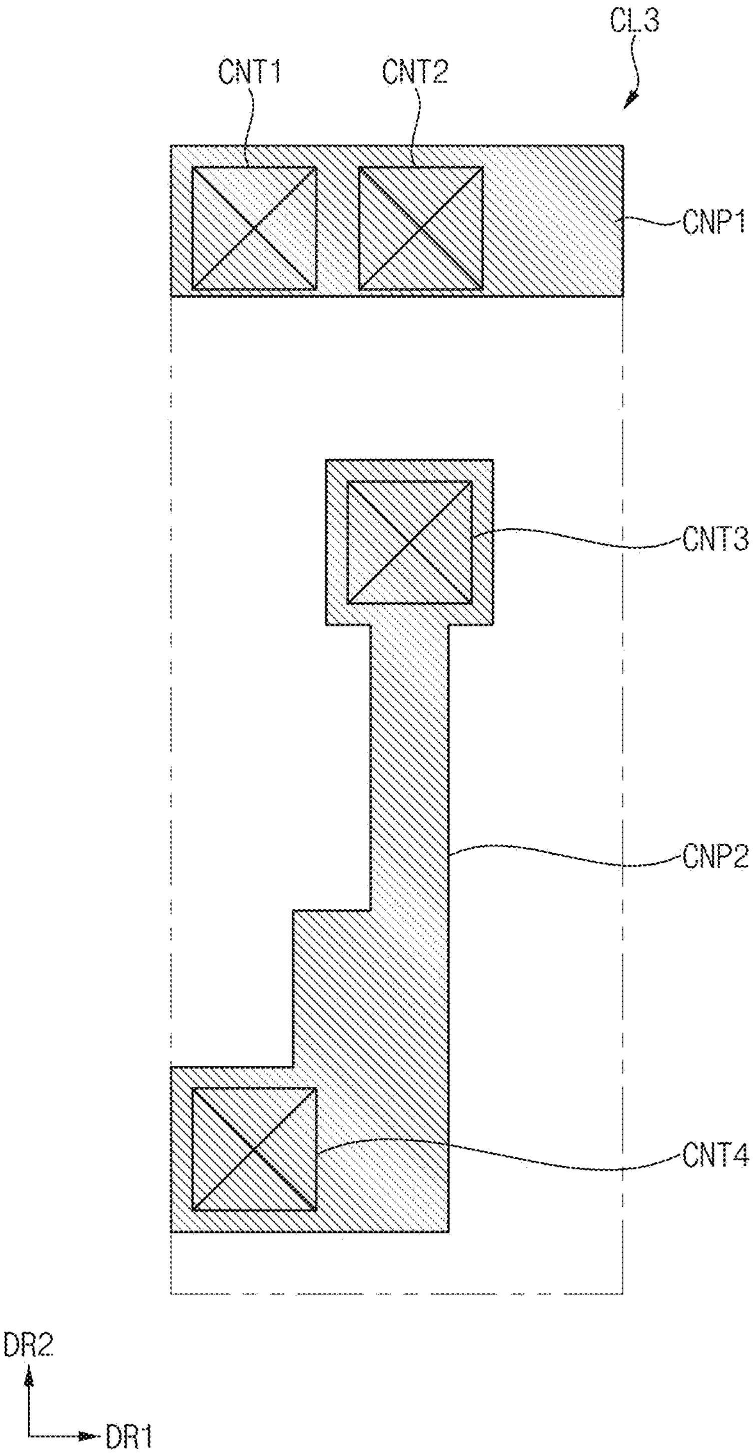
Figure 10:
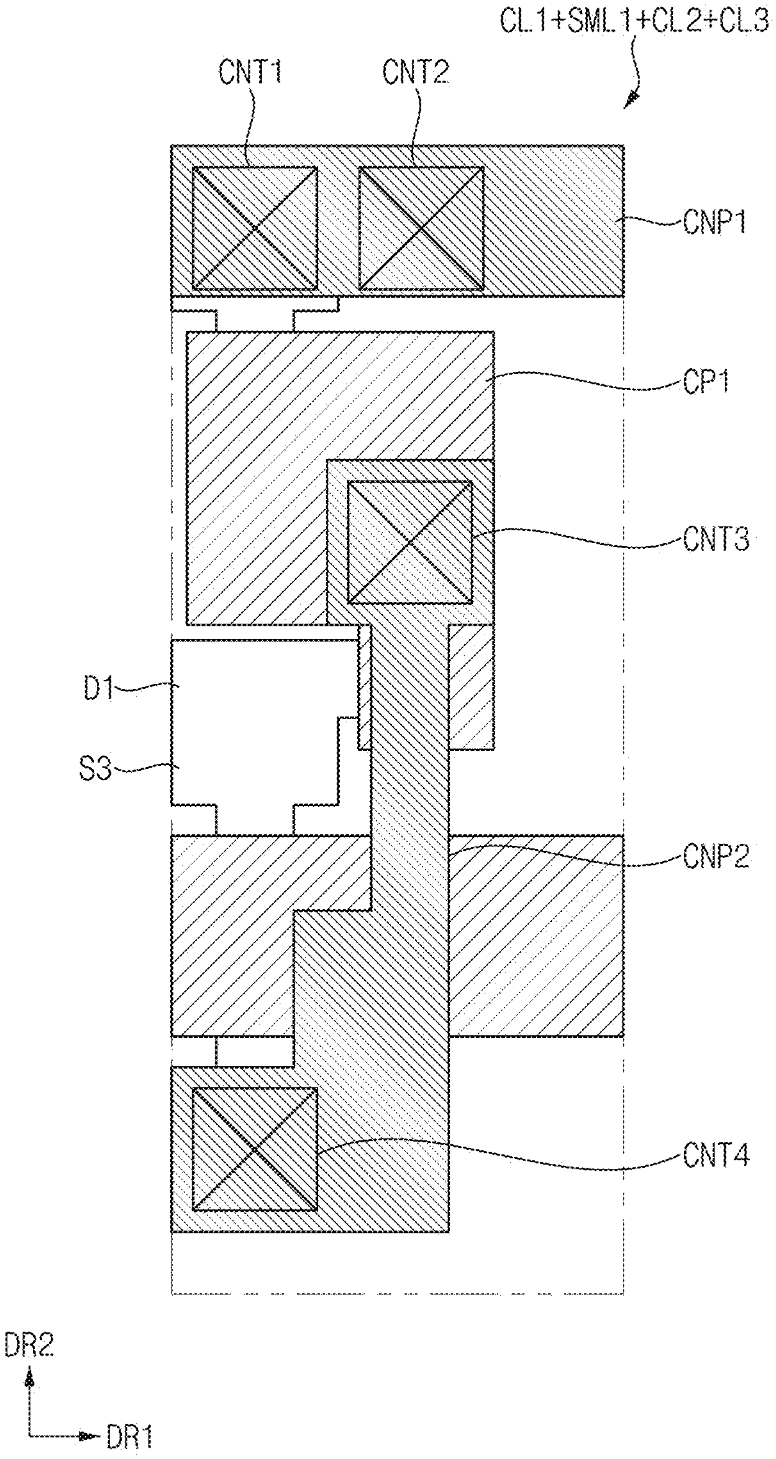

FIG. 9 illustrates the third conductive layer CL3, and FIG. 10 illustrates the view of FIG. 8 with the third conductive layer CL3 further arranged.

In an embodiment, as illustrated in FIGS. 3, 9, and 10, the third conductive layer CL3 may be arranged on the third insulating layer IL3. The third conductive layer CL3 may be arranged on the second conductive layer CL2 and below the second semiconductor layer SML2. That is, the third conductive layer CL3 may be arranged between the second conductive layer CL2 and the second semiconductor layer SML2. The third conductive layer CL3 may include a conductive material. The third conductive layer CL3 may have a single-layer structure or a multi-layer structure including a plurality of conductive layers. In an embodiment, the third conductive layer CL3 may be referred to as a second gate conductive layer.

The third conductive layer CL3 may include or define a first connection pattern CNP1 and a second connection pattern CNP2. The first connection pattern CNP1 and the second connection pattern CNP2 may be spaced apart from each other in a plan view.

In an embodiment, as illustrated in FIGS. 8 and 10, the first connection pattern CNP1 may overlap each of the first source region S1 of the first semiconductor pattern SMP1 and the first power line VDL in a plan view. In an embodiment, the first connection pattern CNP1 may extend in the first direction DR1.

A first portion of the first connection pattern CNP1 may be connected to the first source region S1 of the first semiconductor pattern SMP1 through a first contact hole CNT1 defined or formed by penetrating (or defined or formed through) an insulating layer (e.g., the second and third insulating layers IL2 and IL3) arranged therebelow. In an embodiment, for example, the first contact hole CNT1 may expose a portion of the first source region S1 of the first semiconductor pattern SMP1. The first portion of the first connection pattern CNP1 may contact the portion of the first source region S1 of the first semiconductor pattern SMP1 exposed by the first contact hole CNT1.

A second portion of the first connection pattern CNP1 may be connected to the first power line VDL through a second contact hole CNT2 defined or formed by penetrating an insulating layer (e.g., the first to third insulating layers IL1, IL2, and IL3) arranged therebelow. In an embodiment, for example, the second contact hole CNT2 may expose a portion of the first power line VDL. The second portion of the first connection pattern CNP1 may contact the portion of the first power line VDL exposed by the second contact hole CNT2. Accordingly, the first connection pattern CNP1 may electrically connect the first source region S1 of the first semiconductor pattern SMP1 (i.e., the first electrode of the first transistor T1) and the first power line VDL.

In an embodiment, the second connection pattern CNP2 may be spaced apart from the first connection pattern CNP1 in the direction opposite to the second direction DR2 in a plan view. In an embodiment, the second connection pattern CNP2 may overlap the compensation gate line GCL in a plan view. The second connection pattern CNP2 may be electrically insulated from the compensation gate line GCL.

The second connection pattern CNP2 may overlap each of the first conductive pattern CP1 and the third drain region D3 of the first semiconductor pattern SMP1 in a plan view.

A first portion of the second connection pattern CNP2 may be connected to the first conductive pattern CP1 through a third contact hole CNT3 defined or formed by defined or formed by penetrating an insulating layer (e.g., the third insulating layer IL3) arranged therebelow. In an embodiment, for example, the third contact hole CNT3 may expose a portion of the first conductive pattern CP1. The first portion of the second connection pattern CNP2 may contact the portion of the first conductive pattern CP1 exposed by the third contact hole CNT3.

A second portion of the second connection pattern CNP2 may be connected to the third drain region D3 of the first semiconductor pattern SMP1 through a fourth contact hole CNT4 defined or formed by penetrating an insulating layer (e.g., the second and third insulating layers IL2 and IL3) arranged therebelow. In an embodiment, for example, the fourth contact hole CNT4 may expose a portion of the third drain region D3 of the first semiconductor pattern SMP1. The second portion of the second connection pattern CNP2 may contact the portion of the third drain region D3 of the first semiconductor pattern SMP1 exposed by the fourth contact hole CNT4. Accordingly, the second connection pattern CNP2 may electrically connect the third drain region D3 of the first semiconductor pattern SMP1 (i.e., the second electrode of the third transistor T3) and the first conductive pattern CP1 (i.e., the gate electrode G1 of the first transistor T1).

The fourth insulating layer IL4 may be arranged on the third conductive layer CL3. The fourth insulating layer IL4 may include an inorganic insulating material and/or an organic insulating material. The fourth insulating layer IL4 may have a single-layer structure or a multi-layer structure including a plurality of insulating layers. The fourth insulating layer IL4 may cover the first connection pattern CNP1 and the second connection pattern CNP2.

Figure 11:
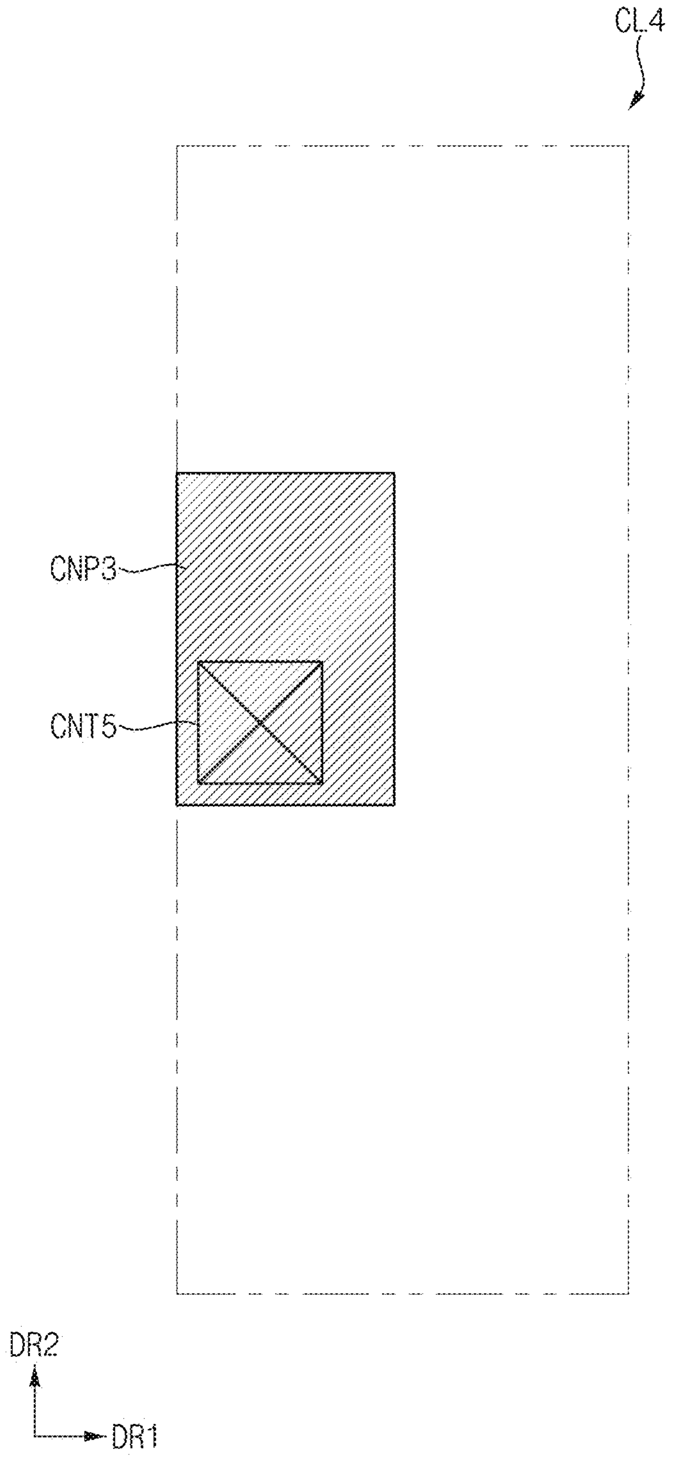
Figure 12:
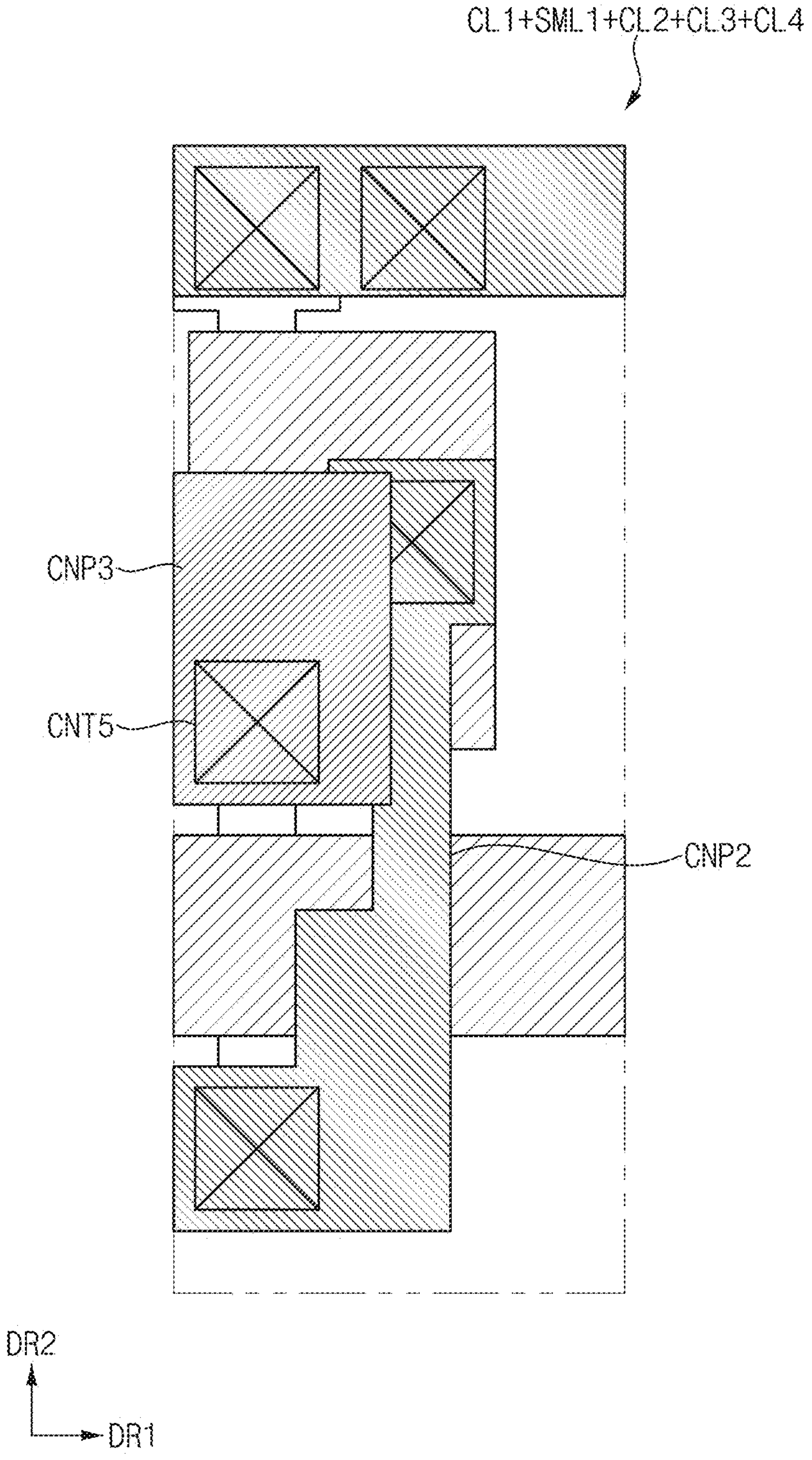

FIG. 11 illustrates the fourth conductive layer CL4, and FIG. 12 illustrates the view of FIG. 10 with the fourth conductive layer CL4 further arranged.

In an embodiment, as illustrated in FIGS. 3, 11, and 12, the fourth conductive layer CL4 may be arranged on the fourth insulating layer IL4. The fourth conductive layer CL4 may be arranged on the third conductive layer CL3 and below the second semiconductor layer SML2. That is, the fourth conductive layer CL4 may be arranged between the third conductive layer CL3 and the second semiconductor layer SML2. The fourth conductive layer CL4 may include a conductive material. The fourth conductive layer CL4 may have a single-layer structure or a multi-layer structure including a plurality of conductive layers. In an embodiment, the fourth conductive layer CL4 may be referred to as a third gate conductive layer.

The fourth conductive layer CL3 may include or define a third connection pattern CNP3. In an embodiment, as illustrated in FIGS. 10 and 12, the third connection pattern CNP3 may overlap the first drain region D1 and the third drain region S3 of the first semiconductor pattern SMP1 in a plan view.

The third connection pattern CNP3 may be connected to the first drain region D1 of the first semiconductor pattern SMP1 (i.e., the second electrode of the first transistor T1) and the third source region S3 (i.e., the first electrode of the third transistor T3) through a fifth contact hole CNT5 defined or formed by penetrating an insulating layer (e.g., the second to fourth insulating layers IL2, IL3, and IL4) arranged therebelow. In an embodiment, for example, the fifth contact hole CNT5 may expose a portion of the first drain region D1 and the third source region S3 of the first semiconductor pattern SMP1. A portion of the third connection pattern CNP3 may contact the portion of the first drain region D1 and the third source region S3 of the first semiconductor pattern SMP1 exposed by the fifth contact hole CNT5.

The fifth insulating layer IL5 may be arranged on the fourth conductive layer CL4. The fifth insulating layer IL5 may include an inorganic insulating material and/or an organic insulating material. The fifth insulating layer IL5 may have a single-layer structure or a multi-layer structure including a plurality of insulating layers. The fifth insulating layer IL5 may cover the third connection pattern CNP3.

Figure 13:
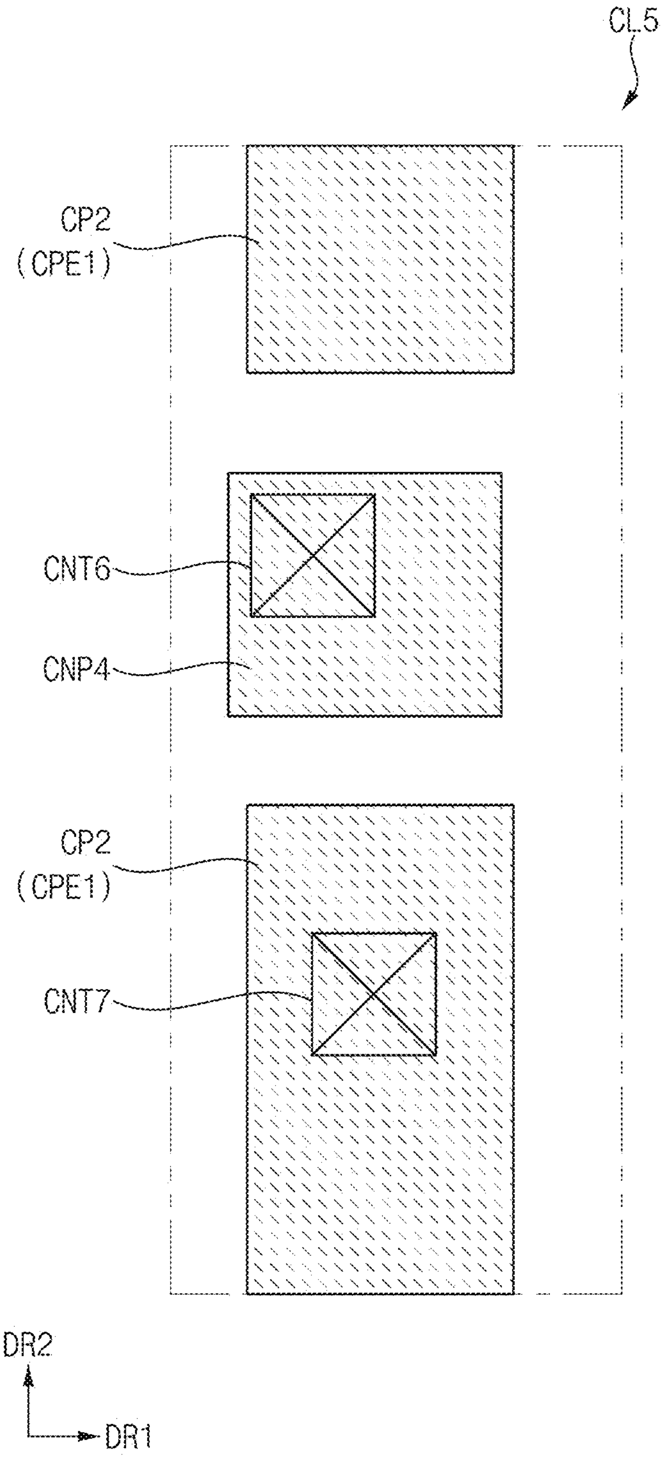
Figure 14:
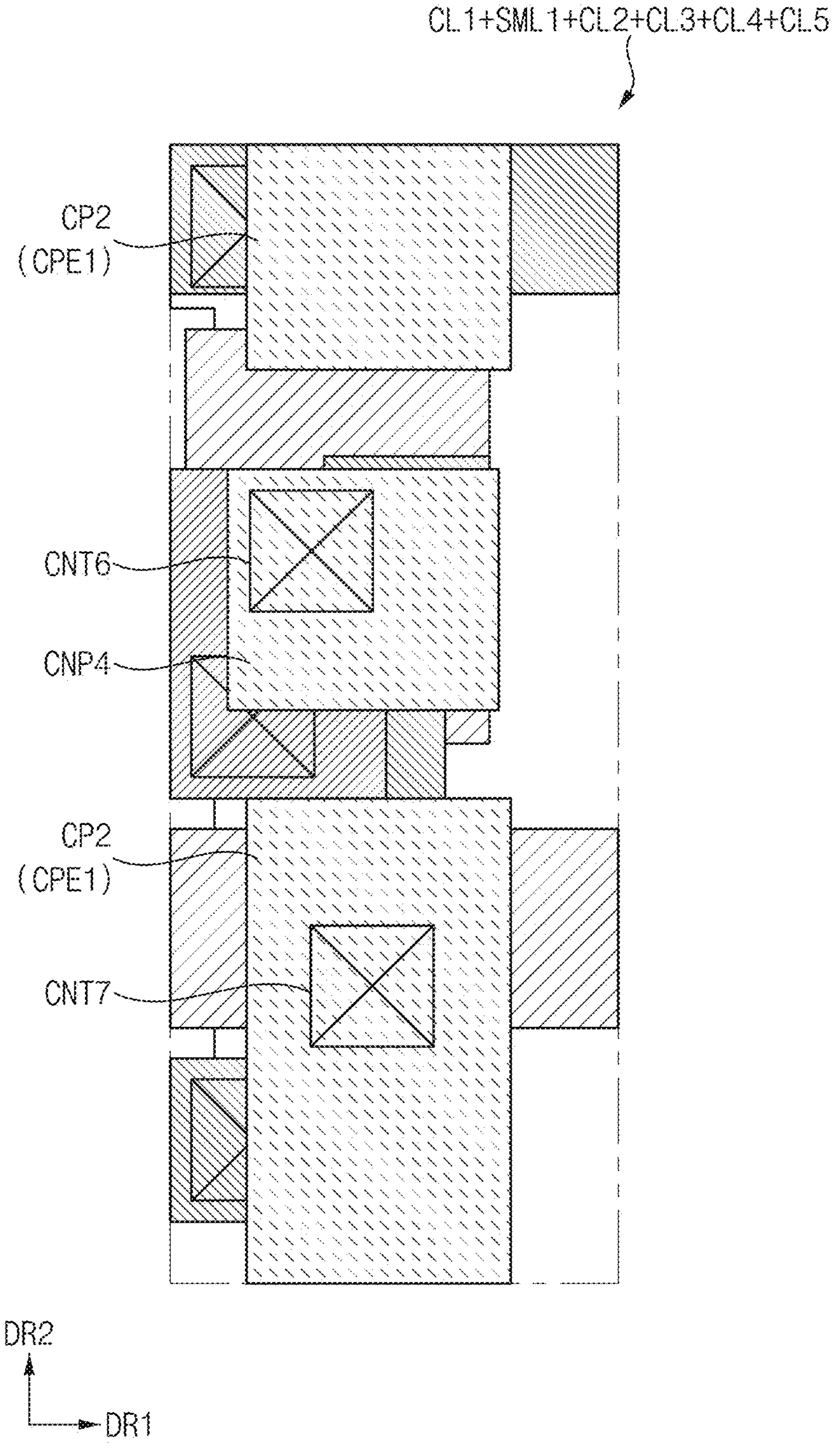

FIG. 13 illustrates the fifth conductive layer CL5, and FIG. 14 illustrates the view of FIG. 12 with the fifth conductive layer CL5 further arranged.

In an embodiment, as illustrated in FIGS. 3, 13, and 14, the fifth conductive layer CL5 may be arranged on the fifth insulating layer IL5. The fifth conductive layer CL5 may be arranged on the fourth conductive layer CL4 and below the second semiconductor layer SML2. That is, the fifth conductive layer CL5 may be arranged between the fourth conductive layer CL4 and the second semiconductor layer SML2. The fifth conductive layer CL5 may include a conductive material. The fifth conductive layer CL5 may have a single-layer structure or a multi-layer structure including a plurality of conductive layers. In an embodiment, the fifth conductive layer CL5 may be referred to as a fourth gate conductive layer.

The fifth conductive layer CL5 may include or define a fourth connection pattern CNP4 and a second conductive pattern CP2. The fourth connection pattern CNP4 and the second conductive pattern CP2 may be spaced apart from each other in a plan view.

In an embodiment, as illustrated in FIGS. 12 and 14, the fourth connection pattern CNP4 may overlap the third connection pattern CNP3 in a plan view. The fourth connection pattern CNP4 may be connected to the third connection pattern CNP3 through a sixth contact hole CNT6 defined or formed by penetrating an insulating layer (e.g., the fifth insulating layer IL5) arranged therebelow. In an embodiment, for example, the sixth contact hole CNT6 may expose a portion of the third connection pattern CNP3. A portion of the fourth connection pattern CNP4 may contact the portion of the third connection pattern CNP3 exposed by the sixth contact hole CNT6.

In an embodiment, the second conductive pattern CP2 may be spaced apart from the third connection pattern CNP3 in the direction opposite to the second direction DR2 in a plan view.

In an embodiment, a portion of the second conductive pattern CP2 may overlap the second connection pattern CNP2 in a plan view. The portion of the second conductive pattern CP2 may be connected to the second connection pattern CNP2 through a seventh contact hole CNT7 defined or formed by penetrating an insulating layer (e.g., the fourth and fifth insulating layers IL4 and IL5) arranged therebelow. In an embodiment, for example, the seventh contact hole CNT7 may expose a portion of the second connection pattern CNP2. The portion of the second conductive pattern CP2 may contact the portion of the second connection pattern CNP2 exposed by the seventh contact hole CNT7. That is, the second conductive pattern CP2 may be electrically connected to each of the third drain region D3 of the first semiconductor pattern SMP1 (i.e., the second electrode of the third transistor T3) and the first conductive pattern CP1 (i.e., the gate electrode G1 of the first transistor T1) through the second connection pattern CNP2. As described below, the second conductive pattern CP2 may be the first electrode CPE1 of the first capacitor C1.

The sixth insulating layer IL6 may be arranged on the fifth conductive layer CL5. The sixth insulating layer IL6 may include an inorganic insulating material and/or an organic insulating material. The sixth insulating layer IL6 may have a single-layer structure or a multi-layer structure including a plurality of insulating layers. The sixth insulating layer IL6 may cover the fourth connection pattern CNP4 and the second conductive pattern CP2.

Figure 15:
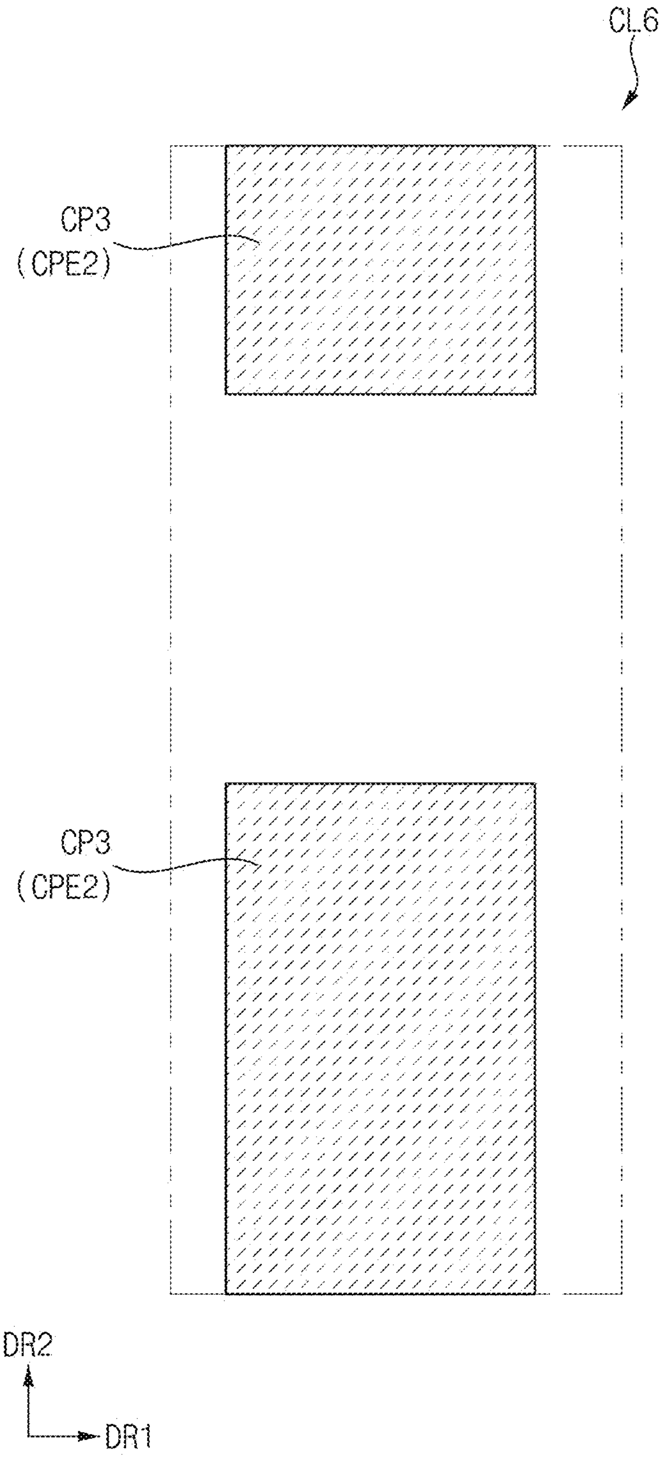
Figure 16:
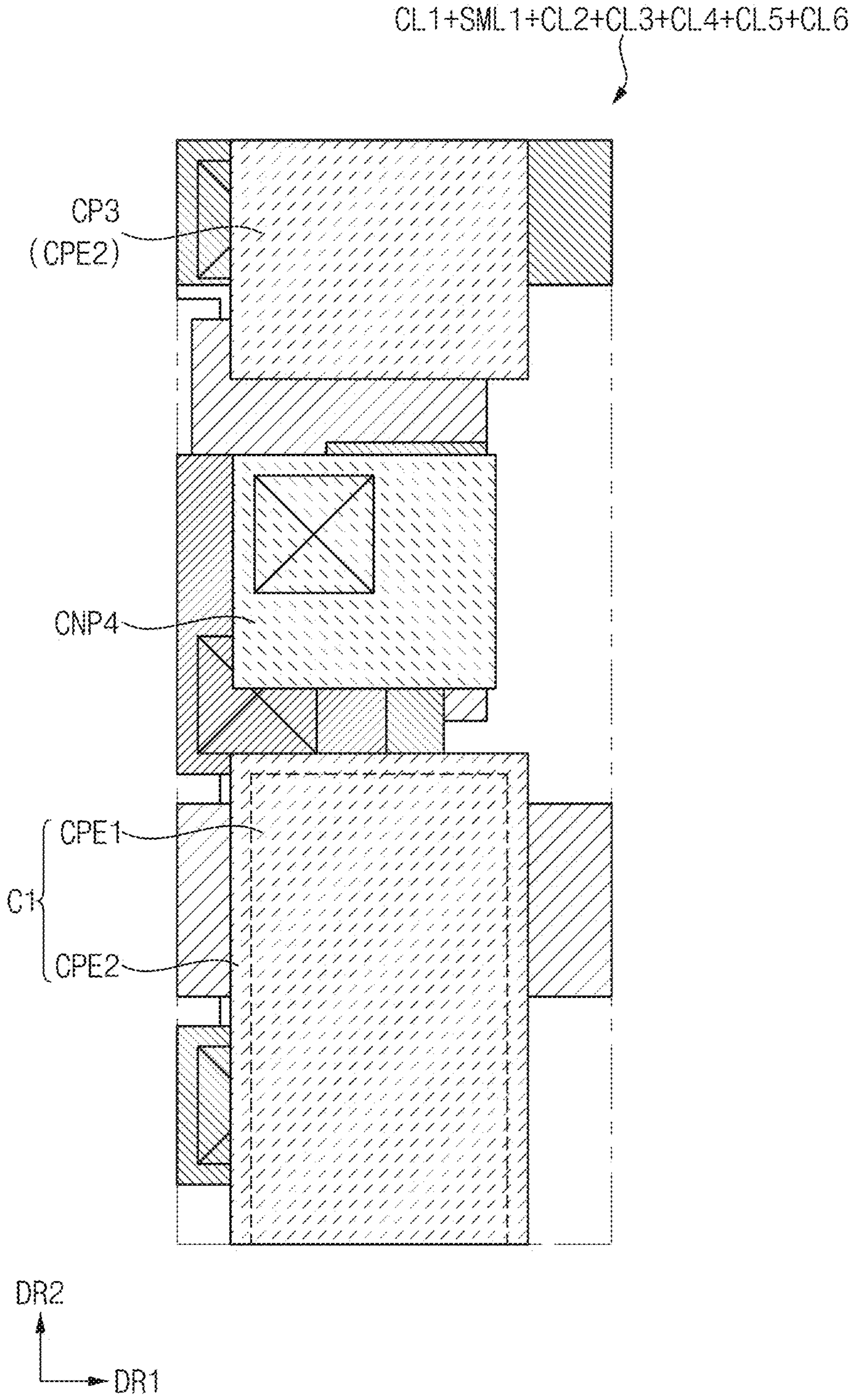

FIG. 15 illustrates the sixth conductive layer CL6, and FIG. 16 illustrates the view of FIG. 14 with the sixth conductive layer CL6 further arranged.

In an embodiment, as illustrated in FIGS. 3, 15, and 16, the sixth conductive layer CL6 may be arranged on the sixth insulating layer IL6. The sixth conductive layer CL6 may be arranged on the fifth conductive layer CL5 and below the second semiconductor layer SML2. That is, the sixth conductive layer CL6 may be arranged between the fifth conductive layer CL5 and the second semiconductor layer SML2. The sixth conductive layer CL6 may include a conductive material. The sixth conductive layer CL6 may have a single-layer structure or a multi-layer structure including a plurality of conductive layers. In an embodiment, the sixth conductive layer CL6 may be referred to as a first contact conductive layer.

The sixth conductive layer CL6 may include or define a third conductive pattern CP3. The third conductive pattern CP3 may overlap the second conductive pattern CP2 in a plan view. In an embodiment, the third conductive pattern CP3 may be spaced apart from the fourth connection pattern CNP4 in the direction opposite to the second direction DR2 in a plan view. That is, the third conductive pattern CP3 may not overlap the fourth connection pattern CNP4 in a plan view.

The second conductive pattern CP2 and the third conductive pattern CP3 spaced apart from each other with the sixth insulating layer IL6 therebetween may form the first capacitor C1. The second conductive pattern CP2 may be the first electrode CPE1 of the first capacitor C1, and the third conductive pattern CP3 may be the second electrode CPE2 of the first capacitor C1. Although FIG. 16 illustrates an embodiment where a size of the third conductive pattern CP3 is larger than a size of the second conductive pattern CP2, the embodiments are not limited thereto.

The seventh insulating layer IL7 may be arranged on the sixth conductive layer CL6. The seventh insulating layer IL7 may include an inorganic insulating material and/or an organic insulating material. The seventh insulating layer IL7 may have a single-layer structure or a multi-layer structure including a plurality of insulating layers. The seventh insulating layer IL7 may cover the third conductive pattern CP3.

Figure 17:
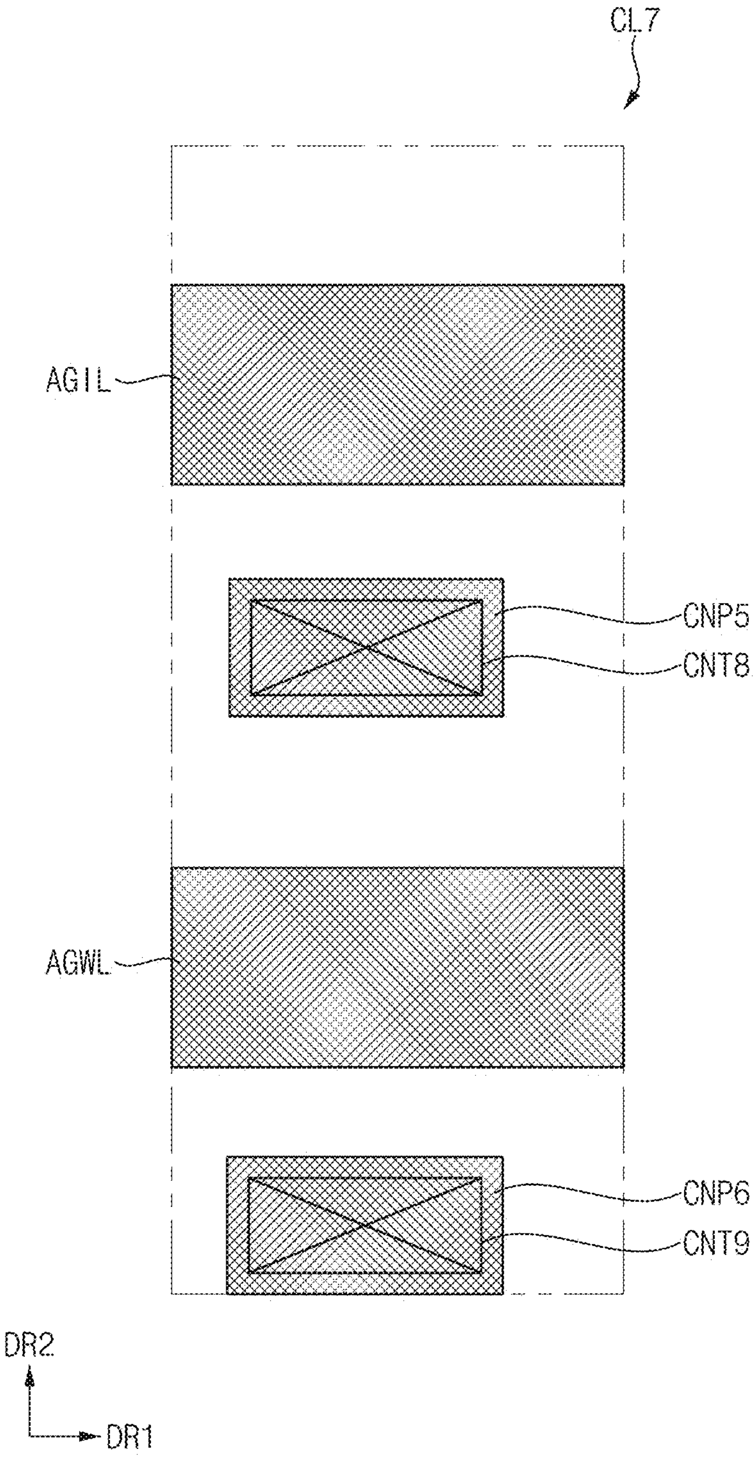
Figure 18:
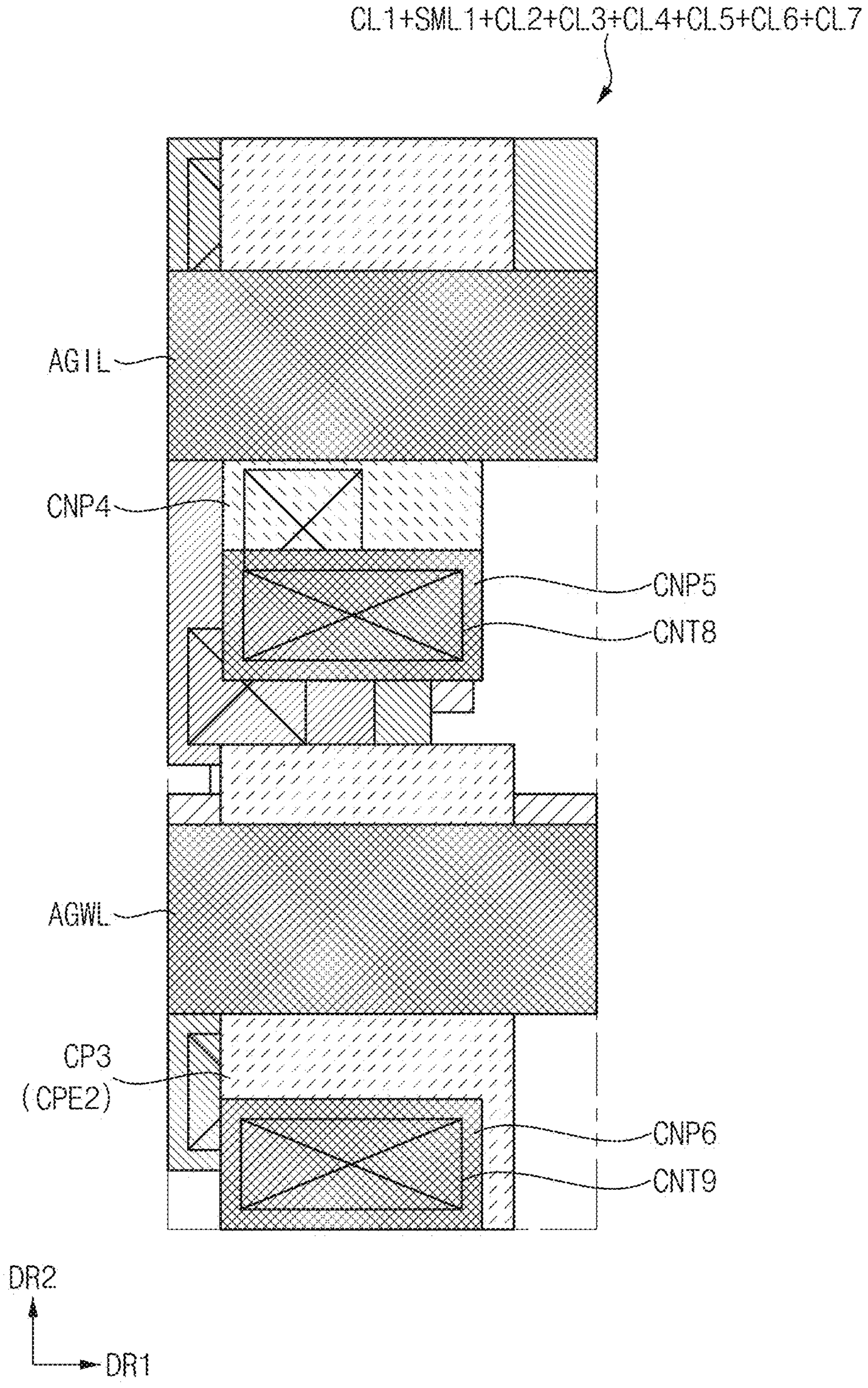

FIG. 17 illustrates the seventh conductive layer CL7, and FIG. 18 illustrates the view of FIG. 16 with the seventh conductive layer CL7 further arranged.

In an embodiment, as illustrated in FIGS. 3, 17, and 18, the seventh conductive layer CL7 may be arranged on the seventh insulating layer IL7. The seventh conductive layer CL7 may be arranged on the sixth conductive layer CL6 and below the second semiconductor layer SML2. That is, the seventh conductive layer CL7 may be arranged between the sixth conductive layer CL6 and the second semiconductor layer SML2. The seventh conductive layer CL7 may include a conductive material. The seventh conductive layer CL7 may have a single-layer structure or a multi-layer structure including a plurality of conductive layers. In an embodiment, the seventh conductive layer CL7 may be referred to as a fifth gate conductive layer.

The seventh conductive layer CL7 may include or define a fifth connection pattern CNP5, a sixth connection pattern CNP6, an auxiliary initialization gate line AGIL, and an auxiliary write gate line AGWL. The fifth connection pattern CNP5, the sixth connection pattern CNP6, the auxiliary initialization gate line AGIL, and the auxiliary write gate line AGWL may be spaced apart from each other in a plan view.

In an embodiment, as illustrated in FIGS. 16 and 18, the fifth connection pattern CNP5 may overlap the fourth connection pattern CNP4 in a plan view. The fifth connection pattern CNP5 may be connected to the fourth connection pattern CNP4 through an eighth contact hole CNT8 defined or formed by penetrating an insulating layer (e.g., the sixth and seventh insulating layers IL6 and IL7) arranged therebelow. In an embodiment, for example, the eighth contact hole CNT8 may expose a portion of the fourth connection pattern CNP4. A portion of the fifth connection pattern CNP5 may contact the portion of the fourth connection pattern CNP4 exposed by the eighth contact hole CNT8.

In an embodiment, the sixth connection pattern CNP6 may be spaced apart from the fifth connection pattern CNP5 in the direction opposite to the second direction DR2 in a plan view. In an embodiment, as illustrated in FIGS. 16 and 18, the sixth connection pattern CNP6 may overlap the third conductive pattern CP3 (i.e., the second electrode CPE2 of the first capacitor C1) in a plan view. The sixth connection pattern CNP6 may be connected to the third conductive pattern CP3 (i.e., the second electrode CPE2 of the first capacitor C1) through a ninth contact hole CNT9 defined or formed by penetrating an insulating layer (e.g., the seventh insulating layer IL7) arranged therebelow. In an embodiment, for example, the ninth contact hole CNT9 may expose a portion of the third conductive pattern CP3. A portion of the sixth connecting pattern CNP6 may contact the portion of the third conductive pattern CP3 exposed by the ninth contact hole CNT9.

In an embodiment, the auxiliary initialization gate line AGIL may extend in the first direction DR1. The auxiliary initialization gate line AGIL may be spaced apart from the fifth connection pattern CNP5 in the second direction DR2 in a plan view. In an embodiment, for example, the auxiliary initialization gate line AGIL may be connected to the initialization gate line GIL arranged in the eighth conductive layer CL8 described below through a contact hole in the peripheral portion. The initialization gate signal GI of FIG. 2 may be applied to the auxiliary initialization gate line AGIL.

In an embodiment, the auxiliary write gate line AGWL may extend in the first direction DR1. The auxiliary write gate line AGWL may be arranged between the fifth connection pattern CNP5 and the sixth connection pattern CNP6 in a plan view. In an embodiment, for example, the auxiliary write gate line AGWL may be connected to the write gate line GWL arranged in the eighth conductive layer CL8 described below through a contact hole in the peripheral portion. The write gate signal GW of FIG. 2 may be applied to the auxiliary write gate line AGWL.

The eighth insulating layer IL8 may be arranged on the seventh conductive layer CL7. The eighth insulating layer IL8 may include an inorganic insulating material and/or an organic insulating material. The eighth insulating layer IL8 may have a single-layer structure or a multi-layer structure including a plurality of insulating layers. The eighth insulating layer IL8 may cover the fifth connection pattern CNP5, the sixth connection pattern CNP6, the auxiliary initialization gate line AGIL, and the auxiliary write gate line AGWL.

Figure 19:
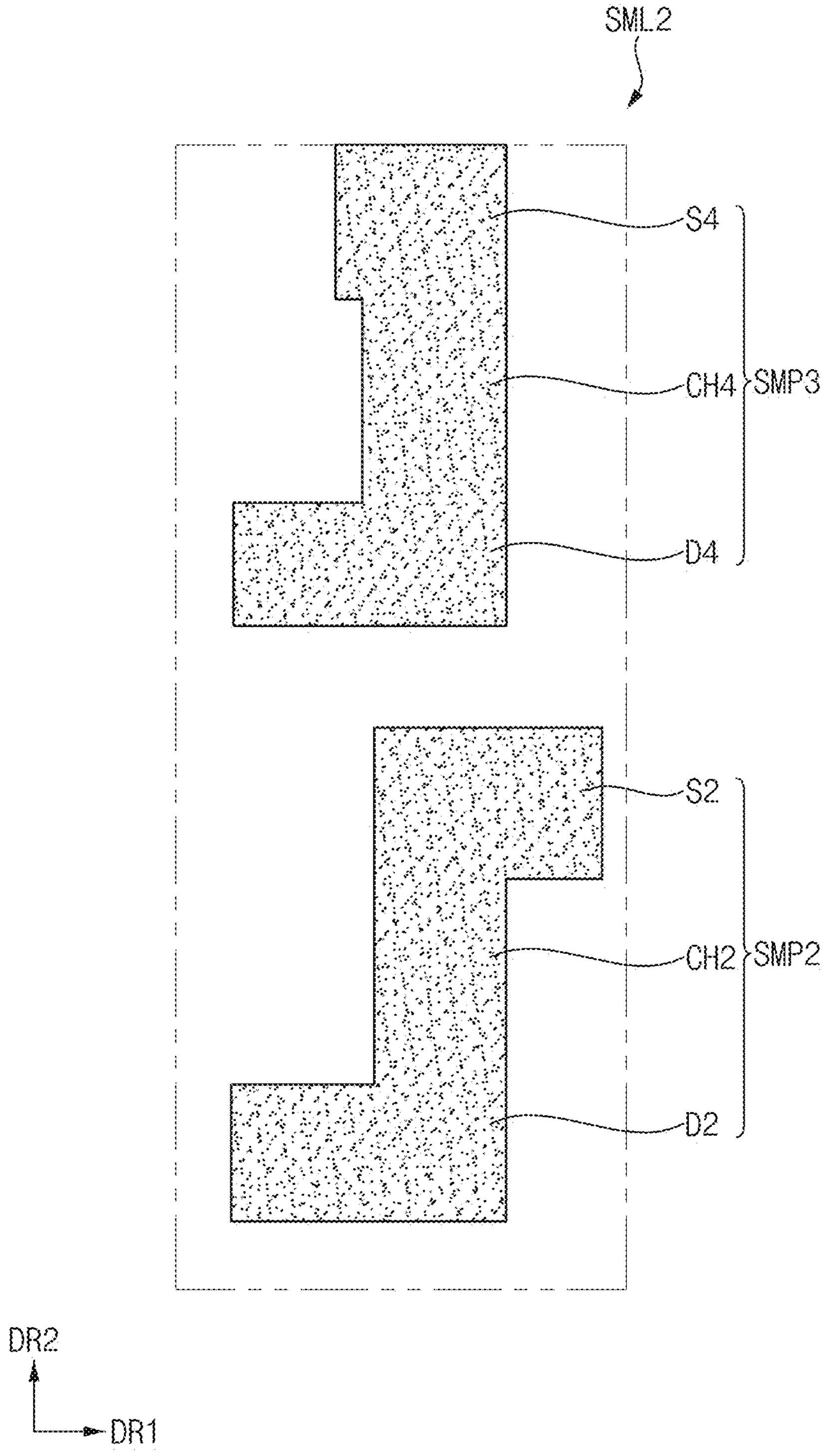
Figure 20:
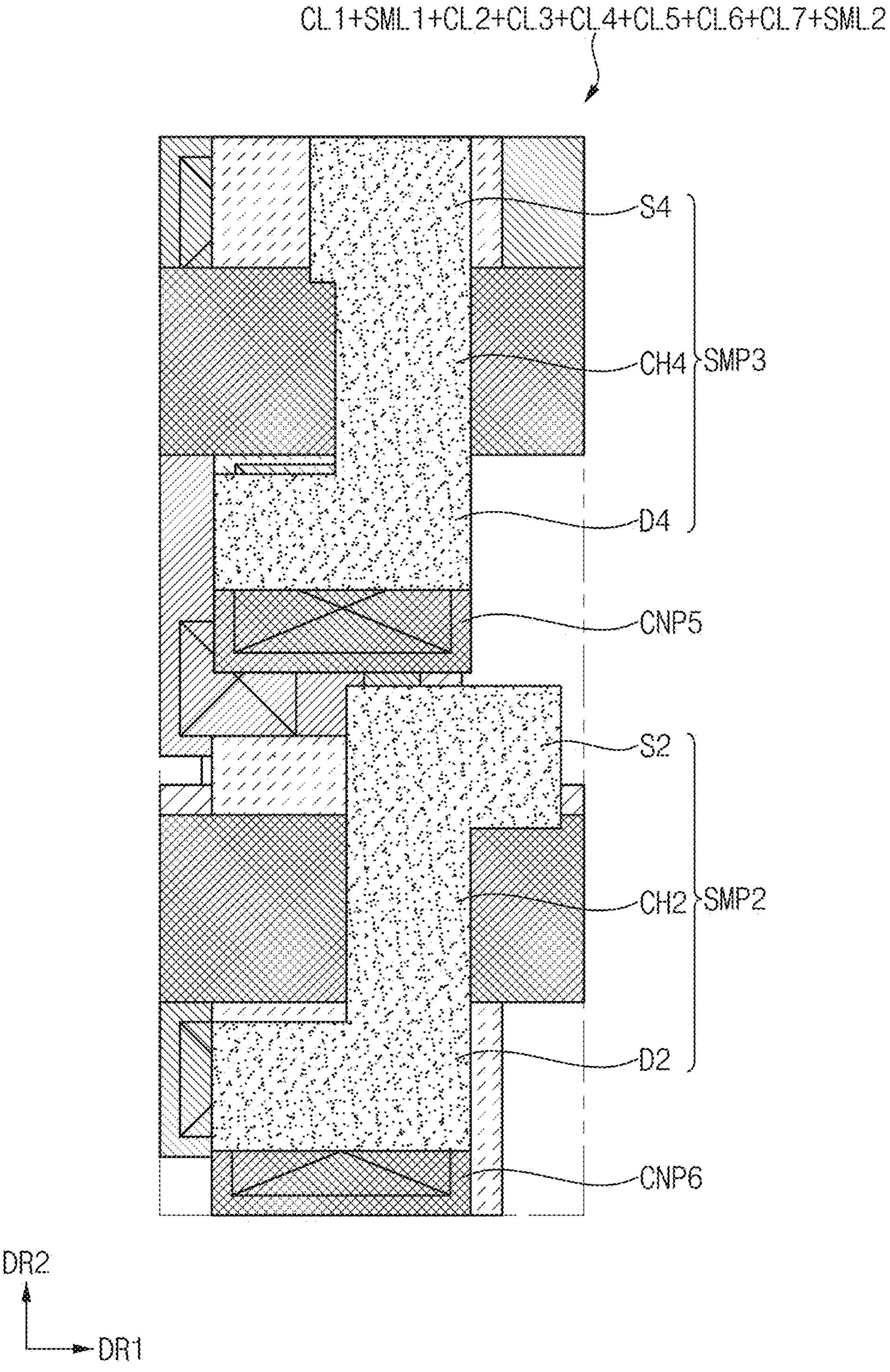

FIG. 19 illustrates the second semiconductor layer SML2, and FIG. 20 illustrates the view of FIG. 18 with the second semiconductor layer SML2 further arranged.

In an embodiment, as illustrated in FIGS. 3, 19, and 20, the second semiconductor layer SML2 may be arranged on the eighth insulating layer IL8. That is, the second semiconductor layer SML2 may be arranged on the first semiconductor layer SML1.

In an embodiment, the second semiconductor layer SML2 may include an oxide semiconductor. In an embodiment, for example, the second semiconductor layer SML2 may include a metal oxide semiconductor. In an embodiment, for example, the second semiconductor layer SML2 may include an oxide of at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn).

The second semiconductor layer SML2 may include or define a second semiconductor pattern SMP2 and a third semiconductor pattern SMP3. The second semiconductor pattern SMP2 and the third semiconductor pattern SMP3 may be spaced apart from each other in a plan view.

The second semiconductor pattern SMP2 may include a second source region S2, a second channel region CH2, and a second drain region D2. The second channel region CH2 may be between the second source region S2 and the second drain region D2. The third semiconductor pattern SMP3 may include a fourth source region S4, a fourth channel region CH4, and a fourth drain region D4. The fourth channel region CH4 may be between the fourth source region S4 and the fourth drain region D4. In an embodiment, the fourth channel region CH4 may be located in the second direction DR2 from the second channel region CH2. In an embodiment, the fourth source region S4, the fourth drain region D4, the second source region S2, and the second drain region D2 may be sequentially arranged along the direction opposite to the second direction DR2.

The second source region S2 may be the first electrode of the second transistor T2, the second drain region D2 may be the second electrode of the second transistor T2, and the second channel region CH2 may be a channel of the second transistor T2. In an embodiment, as illustrated in FIGS. 18 and 20, in a plan view, the second channel region CH2 may overlap the auxiliary write gate line AGWL, and the second drain region D2 may overlap the sixth connection pattern CNP6.

The fourth source region S4 may be the first electrode of the fourth transistor T4, the fourth drain region D4 may be the second electrode of the fourth transistor T4, and the fourth channel region CH4 may be a channel of the fourth transistor T4. In an embodiment, as illustrated in FIGS. 18 and 20, in a plan view, the fourth channel region CH4 may overlap the auxiliary initialization gate line AGIL, and the fourth drain region D4 may overlap the fifth connection pattern CNP5.

The ninth insulating layer IL9 may be arranged on the second semiconductor layer SML2. The ninth insulating layer IL9 may include an inorganic insulating material and/or an organic insulating material. The ninth insulating layer IL9 may have a single-layer structure or a multi-layer structure including a plurality of insulating layers. The ninth insulating layer IL9 may cover the second semiconductor pattern SMP2 and the third semiconductor pattern SMP3.

Figure 21:
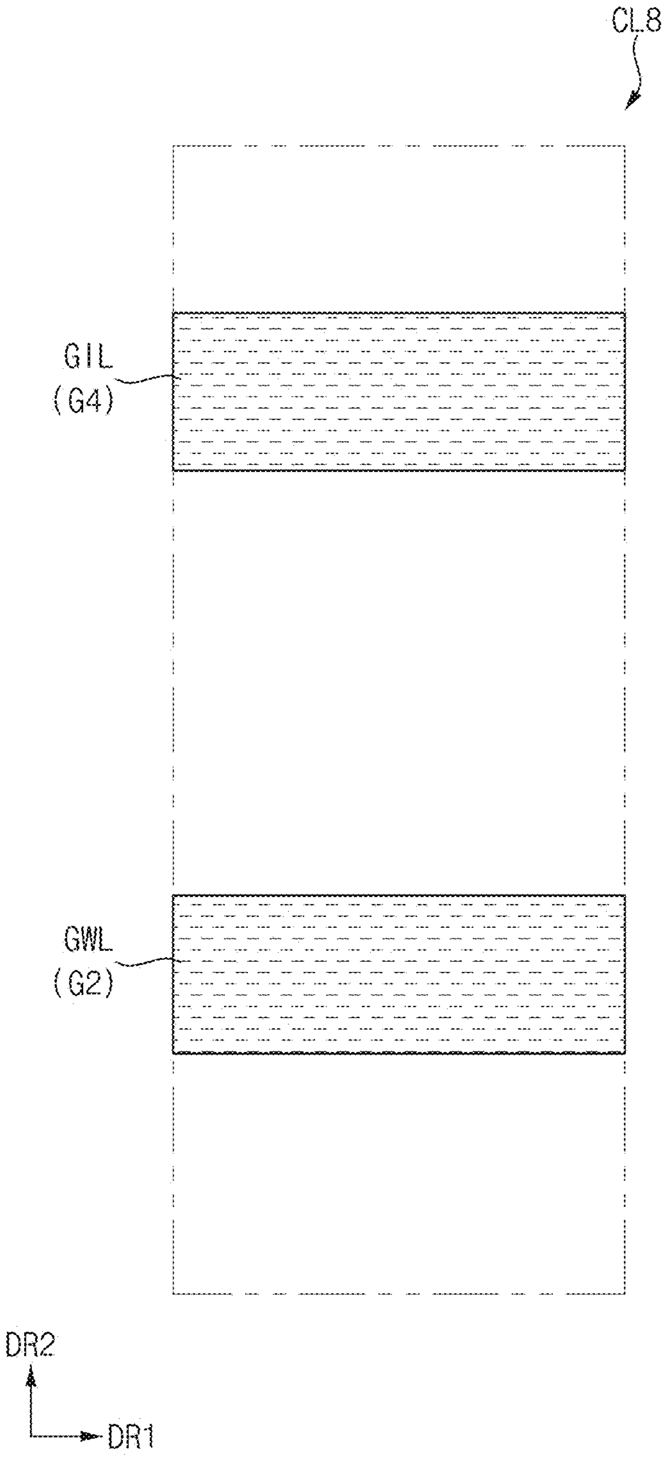
Figure 22:
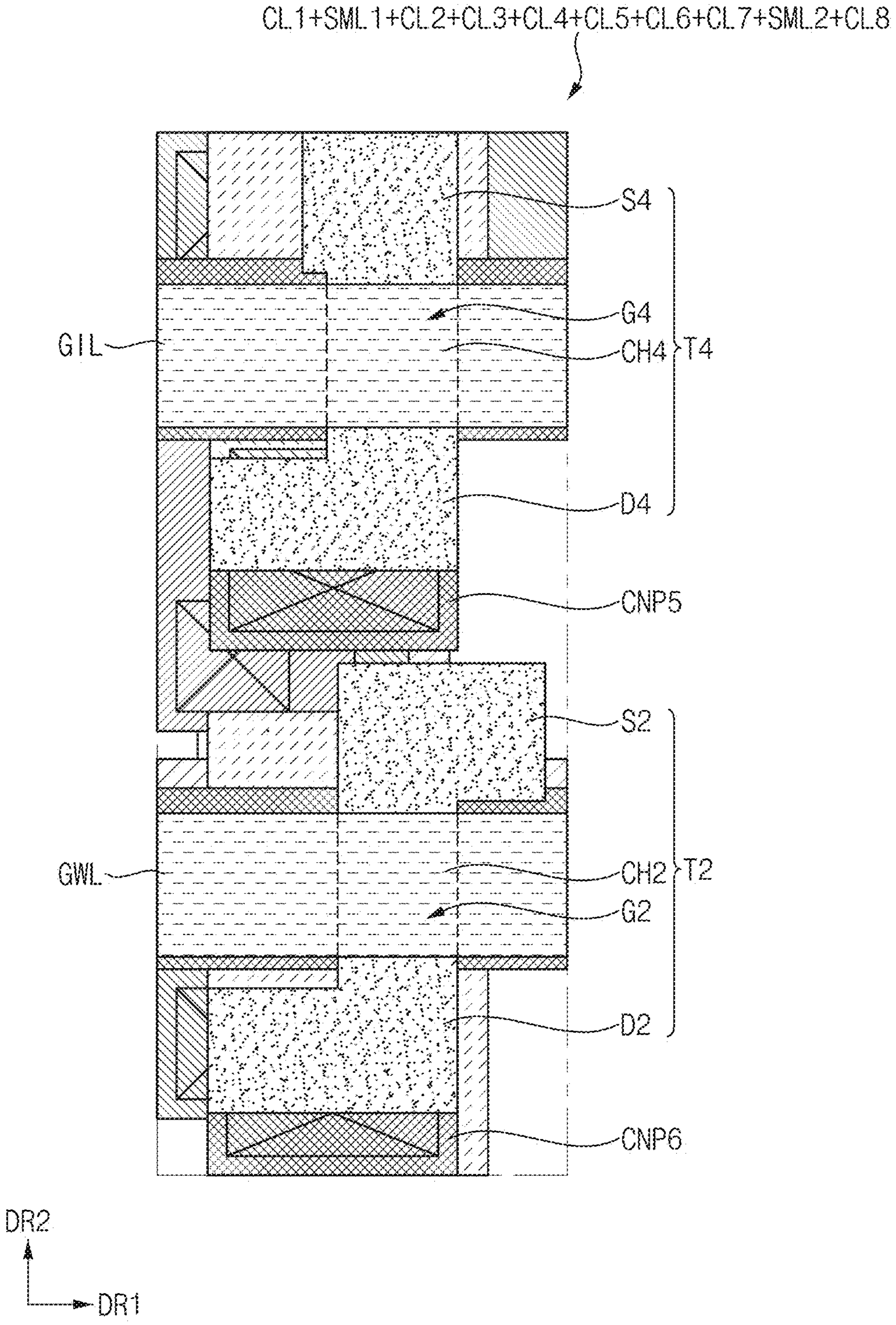

FIG. 21 illustrates the eighth conductive layer CL8, and FIG. 22 illustrates the view of FIG. 20 with the eighth conductive layer CL8 further arranged.

In an embodiment, as illustrated in FIGS. 3, 21, and 22, the eighth conductive layer CL8 may be arranged on the ninth insulating layer IL9. The eighth conductive layer CL8 may be arranged on the second semiconductor layer SML2. The eighth conductive layer CL8 may include a conductive material. The eighth conductive layer CL8 may have a single-layer structure or a multi-layer structure including a plurality of conductive layers. In an embodiment, the eighth conductive layer CL8 may be referred to as a sixth gate conductive layer.

The eighth conductive layer CL8 may include or define the write gate line GWL and the initialization gate line GIL. The write gate line GWL and the initialization gate line GIL may be spaced apart from each other in a plan view.

In an embodiment, the write gate line GWL may extend in the first direction DR1. The write gate signal GW of FIG. 2 may be applied to the write gate line GWL.

A portion of the write gate line GWL may overlap the second channel region CH2 of the second semiconductor pattern SMP2 in a plan view. The portion of the write gate line GWL overlapping the second channel region CH2 may be the gate electrode G2 of the second transistor T2.

In an embodiment, the initialization gate line GIL may extend in the first direction DR1. The initialization gate line GIL may be spaced apart from the write gate line GWL in the second direction DR2 in a plan view. The initialization gate signal GI of FIG. 2 may be applied to the initialization gate line GIL.

A portion of the initialization gate line GIL may overlap the fourth channel region CH4 of the third semiconductor pattern SMP3 in a plan view. The portion of the initialization gate line GIL overlapping the fourth channel region CH4 may be the gate electrode G4 of the fourth transistor T4.

The tenth insulating layer IL10 may be arranged on the eighth conductive layer CL8. The tenth insulating layer IL10 may include an inorganic insulating material and/or an organic insulating material. The tenth insulating layer IL10 may have a single-layer structure or a multi-layer structure including a plurality of insulating layers. The tenth insulating layer IL10 may cover the write gate line GWL and the initialization gate line GIL.

Figure 23:
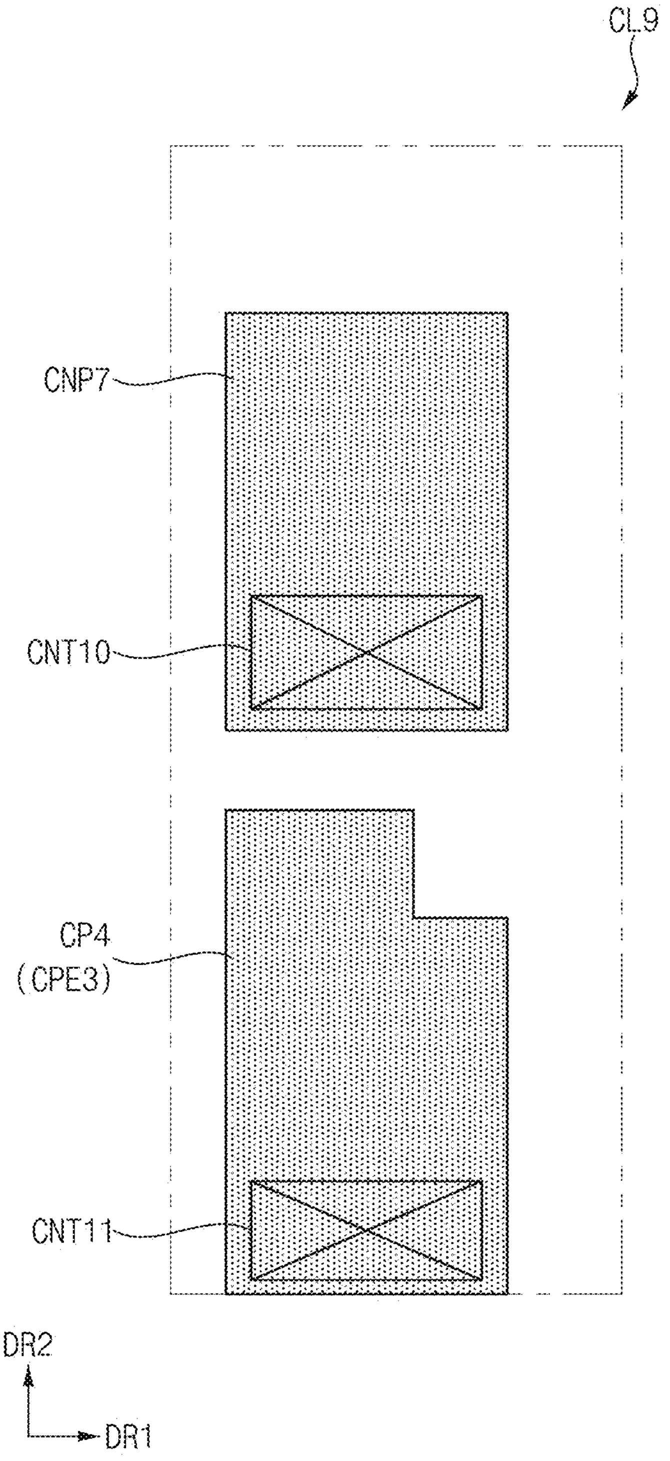
Figure 24:
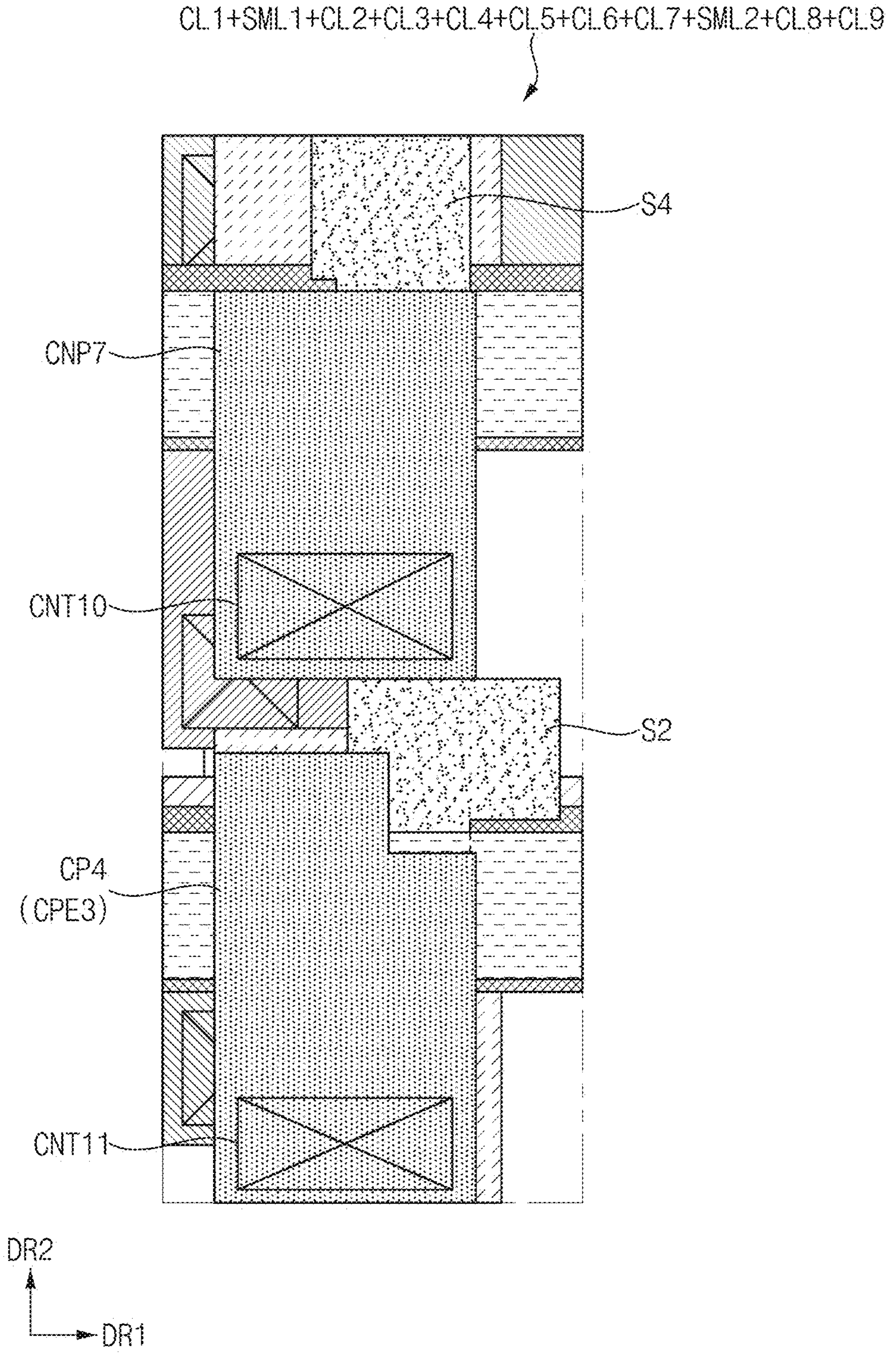

FIG. 23 illustrates the ninth conductive layer CL9, and FIG. 24 illustrates the view of FIG. 22 with the ninth conductive layer CL9 further arranged.

In an embodiment, as illustrated in FIGS. 3, 23, and 24, the ninth conductive layer CL9 may be arranged on the tenth insulating layer IL10. The ninth conductive layer CL9 may be arranged on the eighth conductive layer CL8. The ninth conductive layer CL9 may include a conductive material. The ninth conductive layer CL9 may have a single-layer structure or a multi-layer structure including a plurality of conductive layers. In an embodiment, the ninth conductive layer CL9 may be referred to as a first source conductive layer.

The ninth conductive layer CL9 may include or define a seventh connection pattern CNP7 and a fourth conductive pattern CP4. The seventh connection pattern CNP7 and the fourth conductive pattern CP4 may be spaced apart from each other in a plan view.

As illustrated in FIG. 22 and FIG. 24, a portion of the seventh connection pattern CNP7 may overlap the fifth connection pattern CNP5 and the fourth drain region D4 of the third semiconductor pattern SMP3 in a plan view. The portion of the seventh connection pattern CNP7 may be connected to the fifth connection pattern CNP5 and the fourth drain region D4 of the third semiconductor pattern SMP3 through a tenth contact hole CNT10 defined or formed by defined or formed by penetrating an insulating layer (e.g., the eighth to tenth insulating layers IL8, IL9, and IL10) arranged therebelow. In an embodiment, for example, the tenth contact hole CNT10 may expose a portion of the fifth connection pattern CNP5 and a portion of the fourth drain region D4 of the third semiconductor pattern SMP3. That is, the tenth contact hole CNT10 may overlap each of the fifth connection pattern CNP5 and the fourth drain region D4 of the third semiconductor pattern SMP3. The portion of the seventh connection pattern CNP7 may contact the portion of the fifth connection pattern CNP5 and the portion of the fourth drain region D4 of the third semiconductor pattern SMP3 exposed by the tenth contact hole CNT10.

Accordingly, the fourth drain region D4 of the third semiconductor pattern SMP3 (i.e., the second electrode of the fourth transistor T4) may be electrically connected to the first drain region D1 of the first semiconductor pattern SMP1 (i.e., the second electrode of the first transistor T1) and the third source region S3 (i.e., the first electrode of the third transistor T3) through the seventh connection pattern CNP7, the fifth connection pattern CNP5, the fourth connection pattern CNP4, and the third connection pattern CNP3.

In an embodiment, the fourth conductive pattern CP4 may be spaced apart from the seventh connection pattern CNP7 in the direction opposite to the second direction DR2 in a plan view.

In an embodiment, a portion of the fourth conductive pattern CP4 may overlap the sixth connection pattern CNP6 and the second drain region D2 of the second semiconductor pattern SMP2 in a plan view. The portion of the fourth conductive pattern CP4 may be connected to the sixth connection pattern CNP6 and the second drain region D2 of the second semiconductor pattern SMP2 through an eleventh contact hole CNT11 defined or formed by penetrating an insulating layer (e.g., the eighth to tenth insulating layers IL8, IL9, and IL10) arranged therebelow. In an embodiment, for example, the eleventh contact hole CNT11 may expose a portion of the sixth connection pattern CNP6 and a portion of the second drain region D2 of the second semiconductor pattern SMP2. That is, the eleventh contact hole CNT11 may overlap each of the sixth connection pattern CNP6 and the second drain region D2 of the second semiconductor pattern SMP2. The portion of the fourth conductive pattern CP4 may contact the portion of the sixth connection pattern CNP6 and the portion of the second drain region D2 of the second semiconductor pattern SMP2 exposed by the eleventh contact hole CNT11. That is, the fourth conductive pattern CP4 may be connected to the second drain region D2 of the second semiconductor pattern SMP2 (i.e., the second electrode of the second transistor T2) and also connected to the third conductive pattern CP3 (i.e., the second electrode of the first capacitor C1) through the sixth connection pattern CNP6. As described below, the fourth conductive pattern CP4 may be the first electrode CPE3 of the second capacitor C2.

The eleventh insulating layer IL11 may be arranged on the ninth conductive layer CL9. The eleventh insulating layer IL11 may include an inorganic insulating material and/or an organic insulating material. The eleventh insulating layer IL11 may have a single-layer structure or a multi-layer structure including a plurality of insulating layers. The eleventh insulating layer IL11 may cover the seventh connection pattern CNP7 and the fourth conductive pattern CP4.

Figure 25:
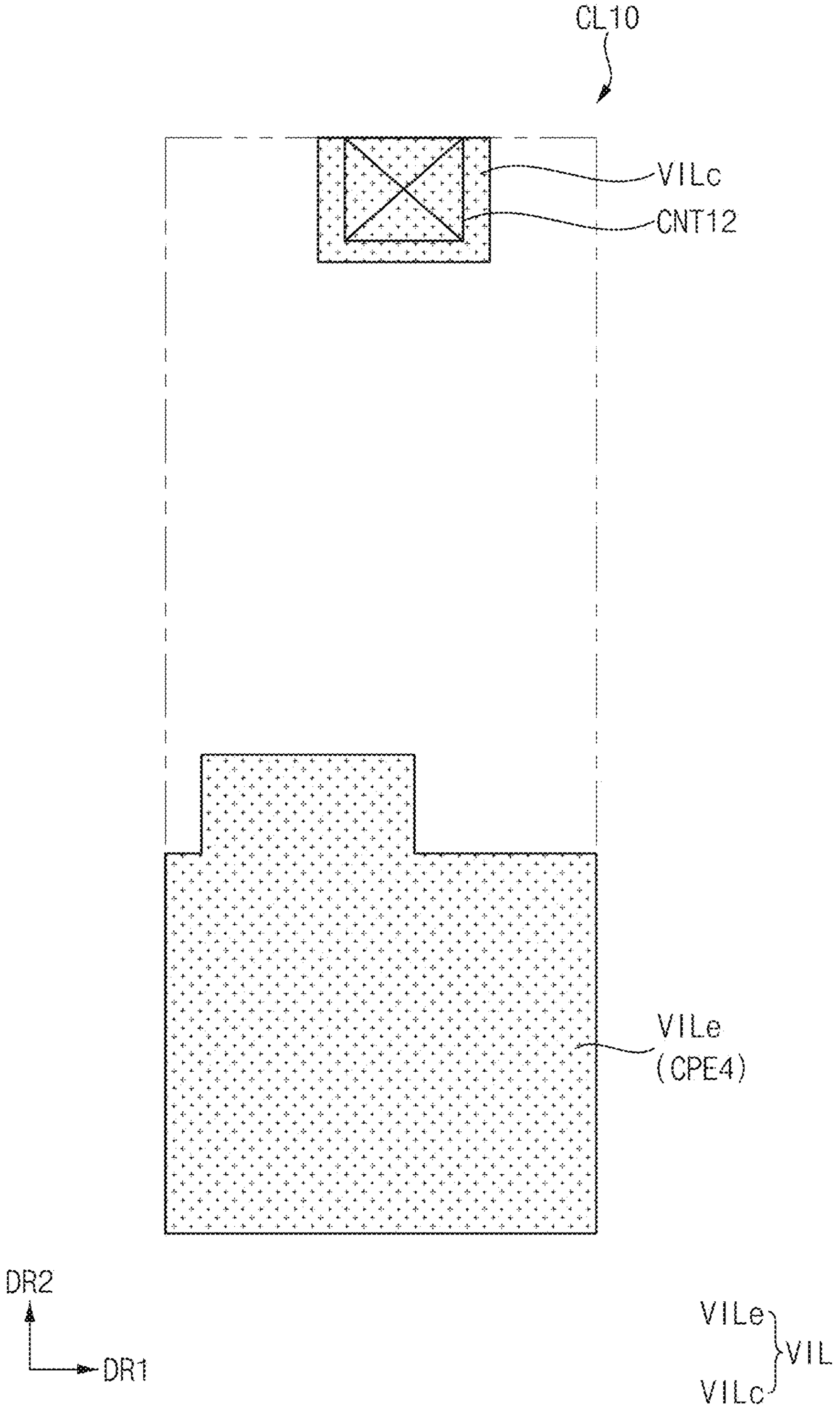
Figure 26:
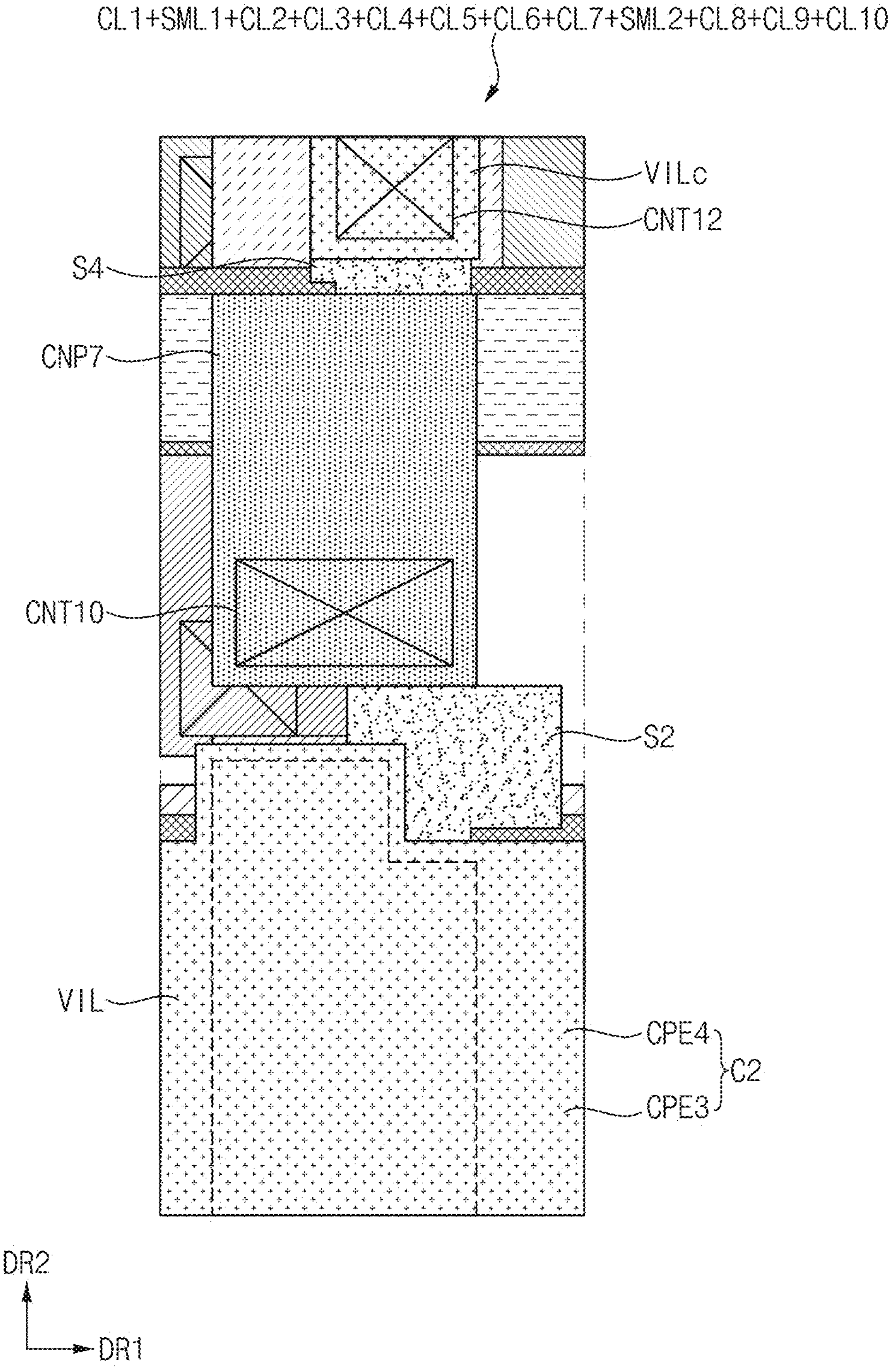

FIG. 25 illustrates the tenth conductive layer CL10, and FIG. 26 illustrates the view of FIG. 24 with the tenth conductive layer CL10 further arranged.

In an embodiment, as illustrated in FIGS. 3, 25, and 26, the tenth conductive layer CL10 may be arranged on the eleventh insulating layer IL11. The tenth conductive layer CL10 may be arranged on the ninth conductive layer CL9. The tenth conductive layer CL10 may include a conductive material. The tenth conductive layer CL10 may have a single-layer structure or a multi-layer structure including a plurality of conductive layers. In an embodiment, the tenth conductive layer CL10 may be referred to as a second contact conductive layer.

The tenth conductive layer CL10 may include or define the initialization line VIL. The initialization voltage VINT of FIG. 2 may be applied to the initialization line VIL.

In an embodiment, the initialization line VIL may include an extension portion VILe extending in the first direction DR1 and a contact portion VILc. The extension portion VILe and the contact portion VILc may be integrally connected (or integrally formed with each other as a single unitary indivisible part). The contact portion VILc may protrude from the extension portion VILe in the direction opposite to the second direction DR2. In an embodiment, for example, the contact portion VILc illustrated in an upper side of FIG. 25 may be a portion included in an adjacent initialization line spaced apart in the second direction DR2 from the initialization line VIL including the extension portion VILe illustrated in an lower side of FIG. 25. In addition, although not illustrated in FIG. 25, a contact portion protruding from the extension portion VILe illustrated in the lower side of FIG. 25 in the direction opposite to the second direction DR2 may be provided.

In an embodiment, as illustrated in FIGS. 24 and 26, a portion of the initialization line VIL (e.g., a portion of the extension portion VILe) may overlap the fourth conductive pattern CP4 in a plan view. The fourth conductive pattern CP4 and the portion of the initialization line VIL spaced apart from each other with the eleventh insulating layer IL11 therebetween may form the second capacitor C2. The fourth conductive pattern CP4 may be the first electrode CPE3 of the second capacitor C2, and the portion of the initialization line VIL overlapping the fourth conductive pattern CP4 may be the second electrode CPE4 of the second capacitor C2.

In an embodiment, as illustrated in FIGS. 16 and 26, the second capacitor C2 may at least partially overlap the first capacitor C1 in a plan view. That is, the first conductive pattern CP2, the third conductive pattern CP3, the fourth conductive pattern CP4, and the initialization line VIL may at least partially overlap each other in a plan view.

In an embodiment, the first capacitor C1 may at least partially overlap each of the channel of the second transistor T2 and the channel of the third transistor T3 in a plan view. In an embodiment, the second capacitor C2 may at least partially overlap each of the channel of the second transistor T2 and the channel of the third transistor T3 in a plan view.

As illustrated in FIG. 8 and FIG. 16, the first capacitor C1 may at least partially overlap the channel of the third transistor T3 in a plan view. That is, each of the second conductive pattern CP2 (i.e., the first electrode CPE1 of the first capacitor C1) and the third conductive pattern CP3 (i.e., the second electrode CPE2 of the first capacitor C1) may at least partially overlap the third channel region CH3 of the first semiconductor pattern SMP1 in a plan view.

As illustrated in FIG. 16 and FIG. 20, the first capacitor C1 may at least partially overlap the channel of the second transistor T2 in a plan view. That is, each of the second conductive pattern CP2 (i.e., the first electrode CPE1 of the first capacitor C1) and the third conductive pattern CP3 (i.e., the second electrode CPE2 of the first capacitor C1) may at least partially overlap the second channel region CH2 of the second semiconductor pattern SMP2 in a plan view.

Similarly, as illustrated in FIG. 8 and FIG. 26, the second capacitor C2 may at least partially overlap the channel of the third transistor T3 in a plan view. That is, each of the fourth conductive pattern CP4 (i.e., the first electrode CPE3 of the second capacitor C2) and the initialization line VIL (i.e., the second electrode CPE4 of the second capacitor C2) may at least partially overlap the third channel region CH3 of the first semiconductor pattern SMP1 in a plan view.

As illustrated in FIG. 20 and FIG. 26, the second capacitor C2 may at least partially overlap the channel of the second transistor T2 in a plan view. That is, each of the fourth conductive pattern CP4 (i.e., the first electrode CPE3 of the second capacitor C2) and the initialization line VIL (i.e., the second electrode CPE4 of the second capacitor C2) may at least partially overlap the second channel region CH2 of the second semiconductor pattern SMP2 in a plan view.

In an embodiment, a portion (e.g., the contact portion VILc) of the adjacent initialization line may overlap the fourth source region S4 of the third semiconductor pattern SMP3 in a plan view. The portion (e.g., the contact portion VILc) of the adjacent initialization line may be connected to the fourth source region S4 of the third semiconductor pattern SMP3 through a twelfth contact hole CNT12 defined or formed by penetrating an insulating layer (e.g., the ninth to eleventh insulating layers IL9, IL10, and IL11) arranged therebelow. In an embodiment, for example, the twelfth contact hole CNT12 may expose a portion of the fourth source region S4 of the third semiconductor pattern SMP3. The portion (e.g., the contact portion VILc) of the adjacent initialization line may contact the portion of the fourth source region S4 of the third semiconductor pattern SMP3 exposed by the twelfth contact hole CNT12. Accordingly, the initialization voltage VINT of FIG. 2 may be applied to the fourth source region S4 of the third semiconductor pattern SMP3 (i.e., the first electrode of the fourth transistor T4) through the adjacent initialization line.

The twelfth insulating layer IL12 may be arranged on the tenth conductive layer CL10. The twelfth insulating layer IL12 may include an inorganic insulating material and/or an organic insulating material. The twelfth insulating layer IL12 may have a single-layer structure or a multi-layer structure including a plurality of insulating layers. The twelfth insulating layer IL12 may cover the initialization line VIL.

Figure 27:
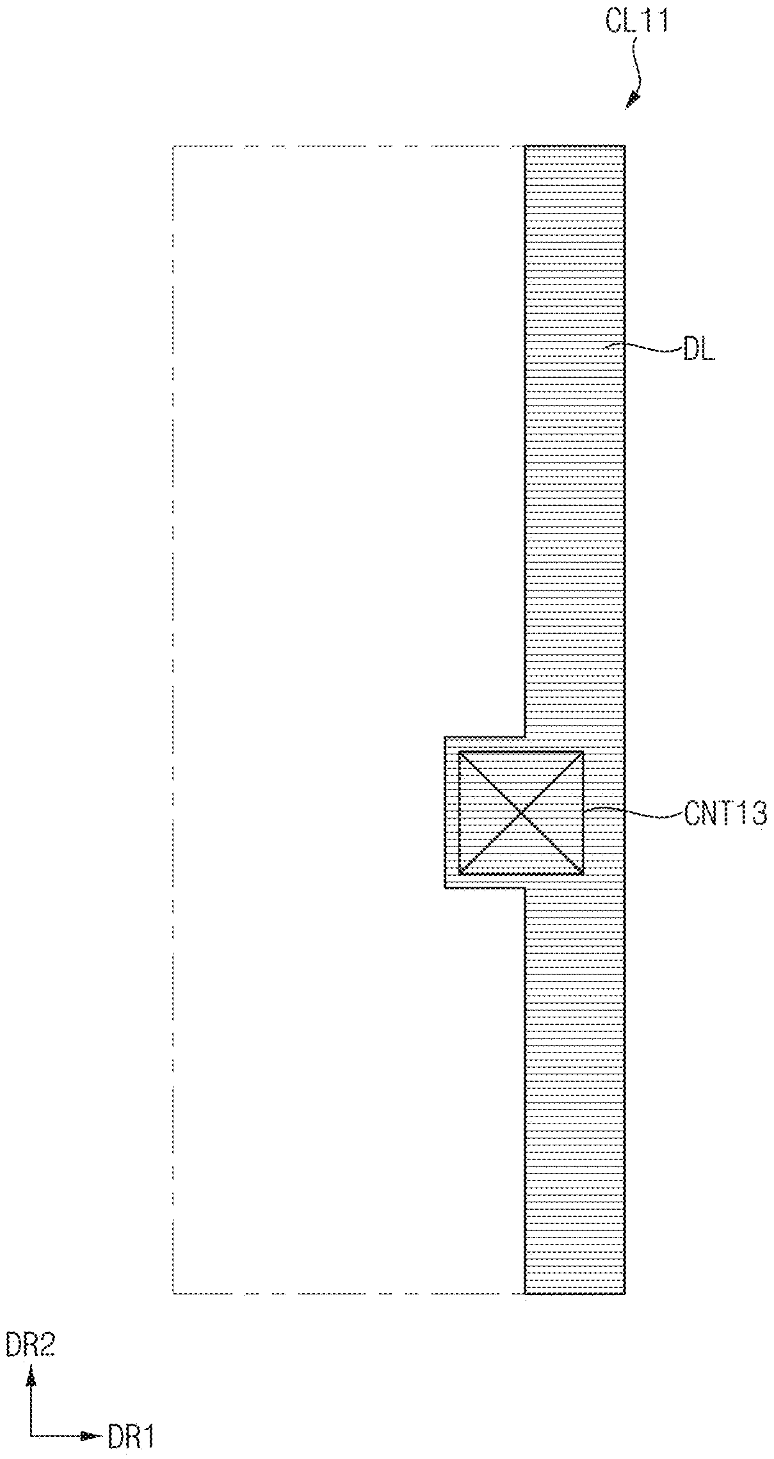
Figure 28:
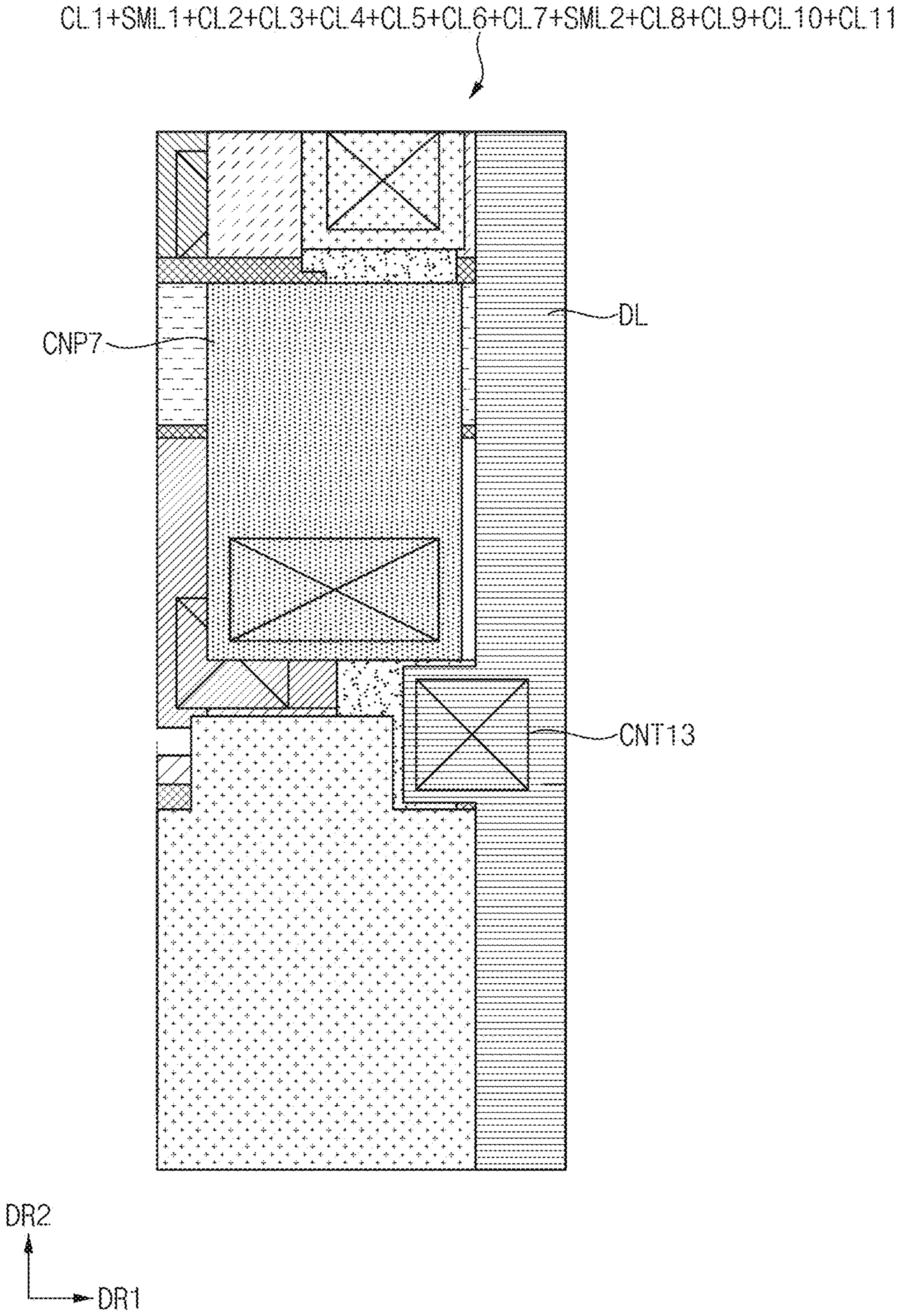

FIG. 27 illustrates the eleventh conductive layer CL11, and FIG. 28 illustrates the view of FIG. 26 with the eleventh conductive layer CL11 further arranged.

In an embodiment, as illustrated in FIGS. 3, 27, and 28, the eleventh conductive layer CL11 may be arranged on the twelfth insulating layer IL12. The eleventh conductive layer CL11 may be arranged on the tenth conductive layer CL10. The eleventh conductive layer CL11 may include a conductive material. The eleventh conductive layer CL11 may have a single-layer structure or a multi-layer structure including a plurality of conductive layers. In an embodiment, the eleventh conductive layer CL11 may be referred to as a second source conductive layer.

The eleventh conductive layer CL11 may include or define the data line DL. The data voltage VDAT of FIG. 2 may be applied to the data line DL.

In an embodiment, the data line DL may extend in the second direction DR2. In an embodiment, as illustrated in FIGS. 26 and 28, a portion of the data line DL may overlap the second source region S2 of the second semiconductor pattern SMP2 in a plan view. The portion of the data line DL may be connected to the second source region S2 of the second semiconductor pattern SMP2 through a thirteenth contact hole CNT13 defined or formed by penetrating an insulating layer (e.g., the ninth to twelfth insulating layers IL9, IL10, IL11, and IL12) arranged therebelow. In an embodiment, for example, the thirteenth contact hole CNT13 may expose a portion of the second source region S2 of the second semiconductor pattern SMP2. The portion of the data line DL may contact the portion of the second source region S2 of the second semiconductor pattern SMP2 exposed by the thirteenth contact hole CNT13. Accordingly, the data voltage VDAT of FIG. 2 may be applied to the second source region S2 of the second semiconductor pattern SMP2 (i.e., the first electrode of the second transistor T2) through the data line DL.

The thirteenth insulating layer IL13 may be arranged on the eleventh conductive layer CL11. The thirteenth insulating layer IL13 may include an inorganic insulating material and/or an organic insulating material. The thirteenth insulating layer IL13 may have a single-layer structure or a multi-layer structure including a plurality of insulating layers. The thirteenth insulating layer IL13 may cover the data line DL.

Figure 29:
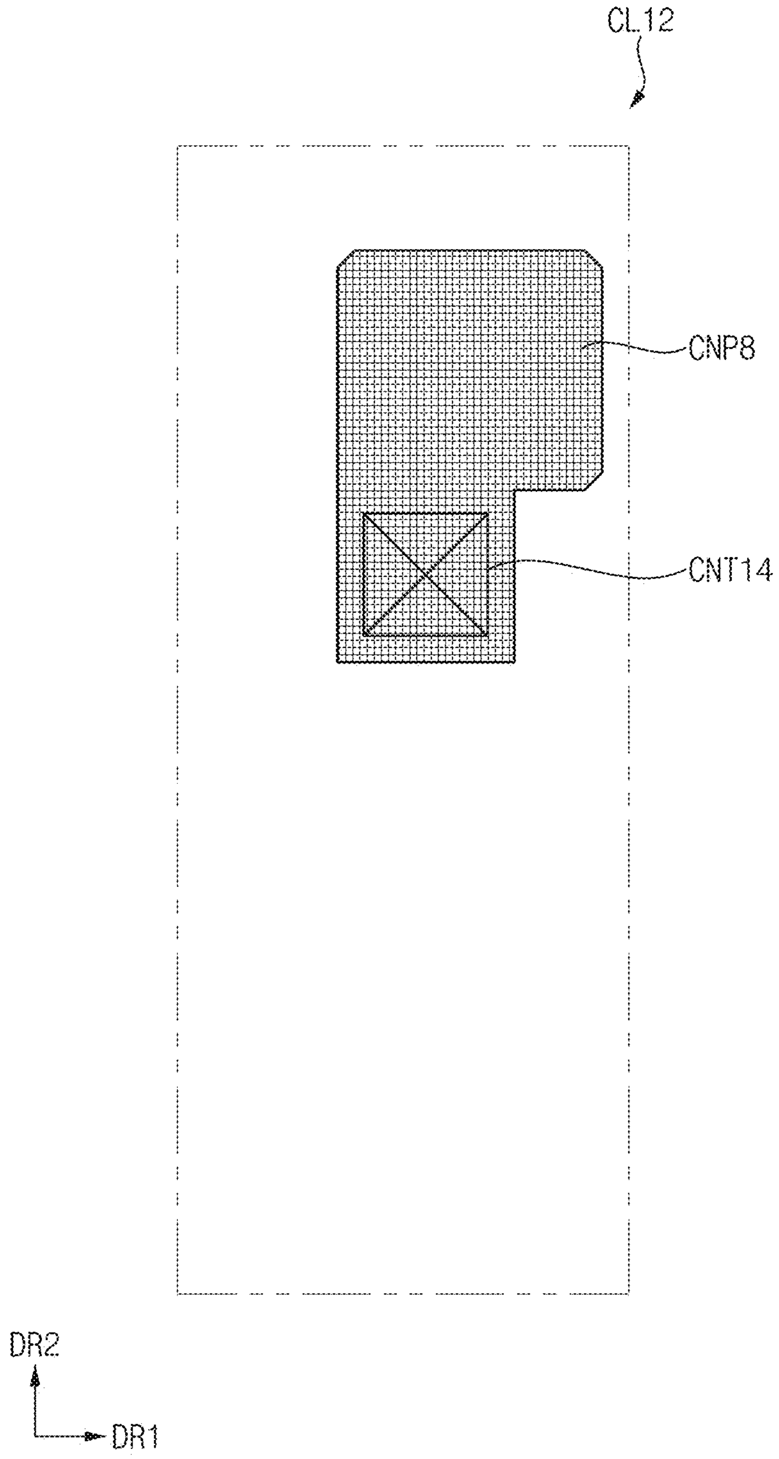
Figure 30:
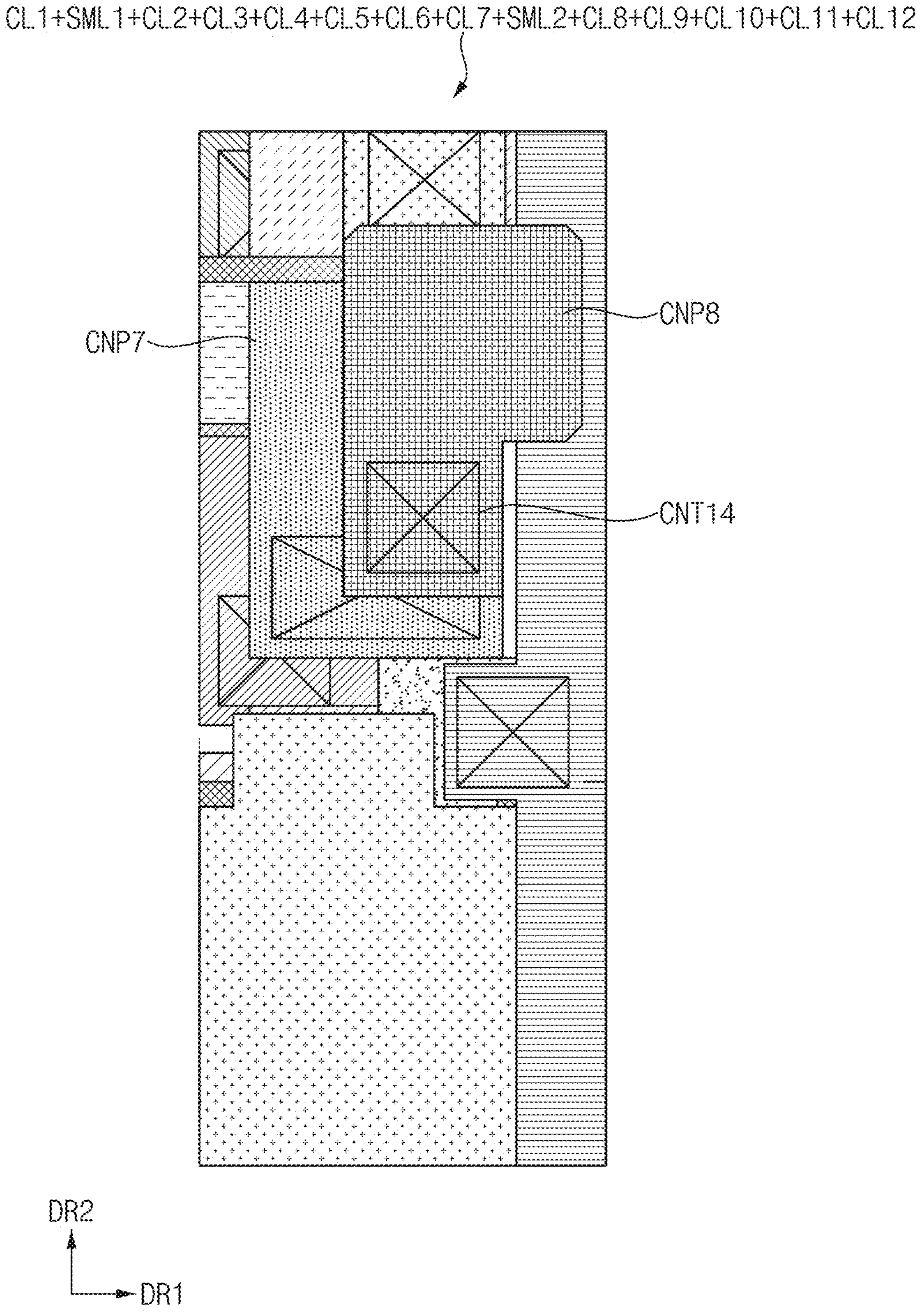

FIG. 29 illustrates the twelfth conductive layer CL12, and FIG. 30 illustrates the view of FIG. 28 with the twelfth conductive layer CL12 further arranged.

In an embodiment, as illustrated in FIGS. 3, 29, and 30, the twelfth conductive layer CL12 may be arranged on the thirteenth insulating layer IL13. The twelfth conductive layer CL12 may be arranged on the eleventh conductive layer CL11. The twelfth conductive layer CL12 may include a conductive material. The twelfth conductive layer CL12 may have a single-layer structure or a multi-layer structure including a plurality of conductive layers. In an embodiment, the twelfth conductive layer CL12 may be referred to as a third source conductive layer.

The twelfth conductive layer CL12 may include or define an eighth connection pattern CNP8. In an embodiment, as illustrated in FIGS. 28 and 30, the eighth connection pattern CNP8 may overlap the seventh connection pattern CNP7 in a plan view. The eighth connection pattern CNP8 may be connected to the seventh connection pattern CNP7 through a fourteenth contact hole CNT14 defined or formed by penetrating an insulating layer (e.g., the eleventh to thirteenth insulating layers IL11, IL12, and IL13) arranged therebelow. In an embodiment, for example, the fourteenth contact hole CNT14 may expose a portion of the seventh connection pattern CNP7. A portion of the eighth connection pattern CNP8 may contact the portion of the seventh connection pattern CNP7 exposed by the fourteenth contact hole CNT14.

The fourteenth insulating layer IL14 may be arranged on the twelfth conductive layer CL12. The fourteenth insulating layer IL14 may include an inorganic insulating material and/or an organic insulating material. The fourteenth insulating layer IL14 may have a single-layer structure or a multi-layer structure including a plurality of insulating layers. The fourteenth insulating layer IL14 may cover the eighth connection pattern CNP8.

Figure 31:
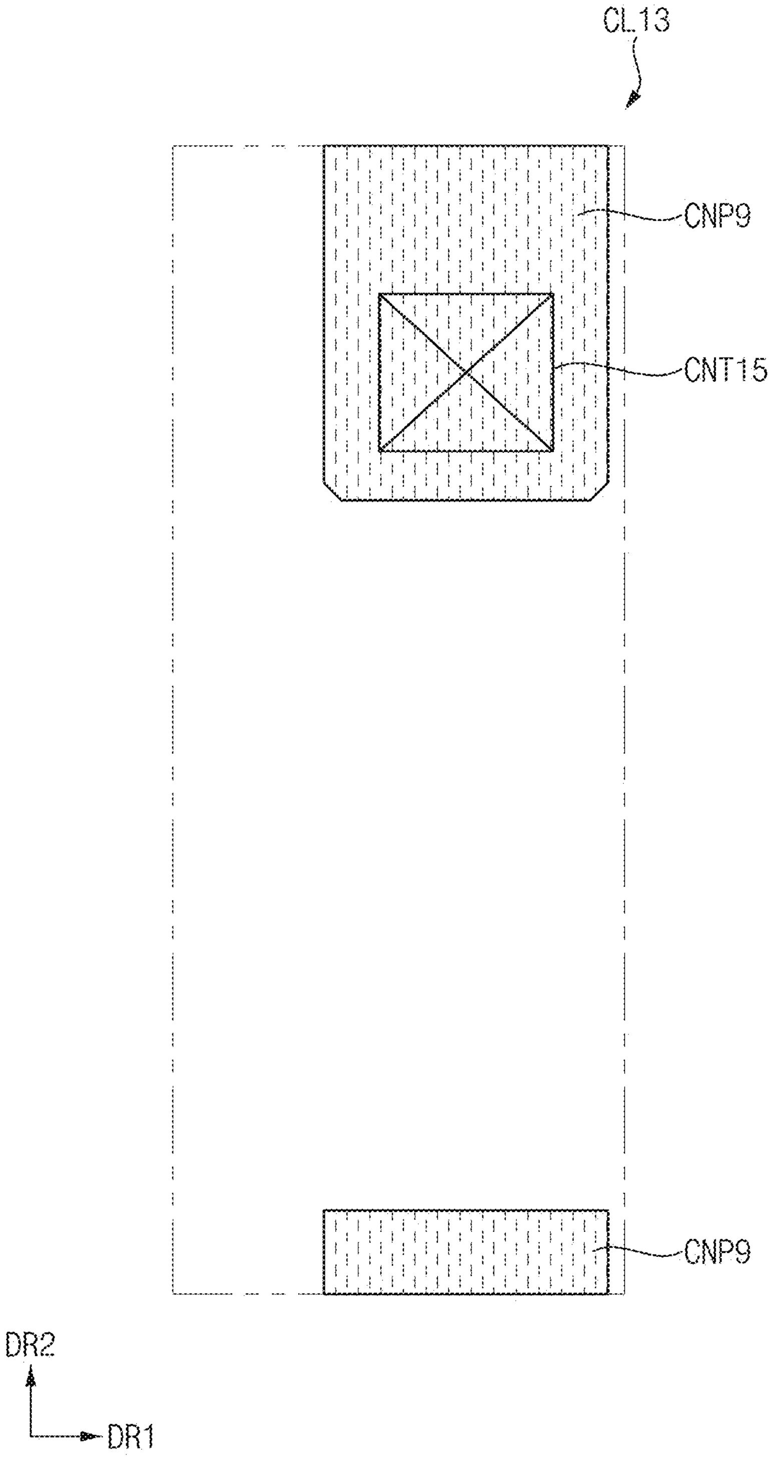
Figure 32:
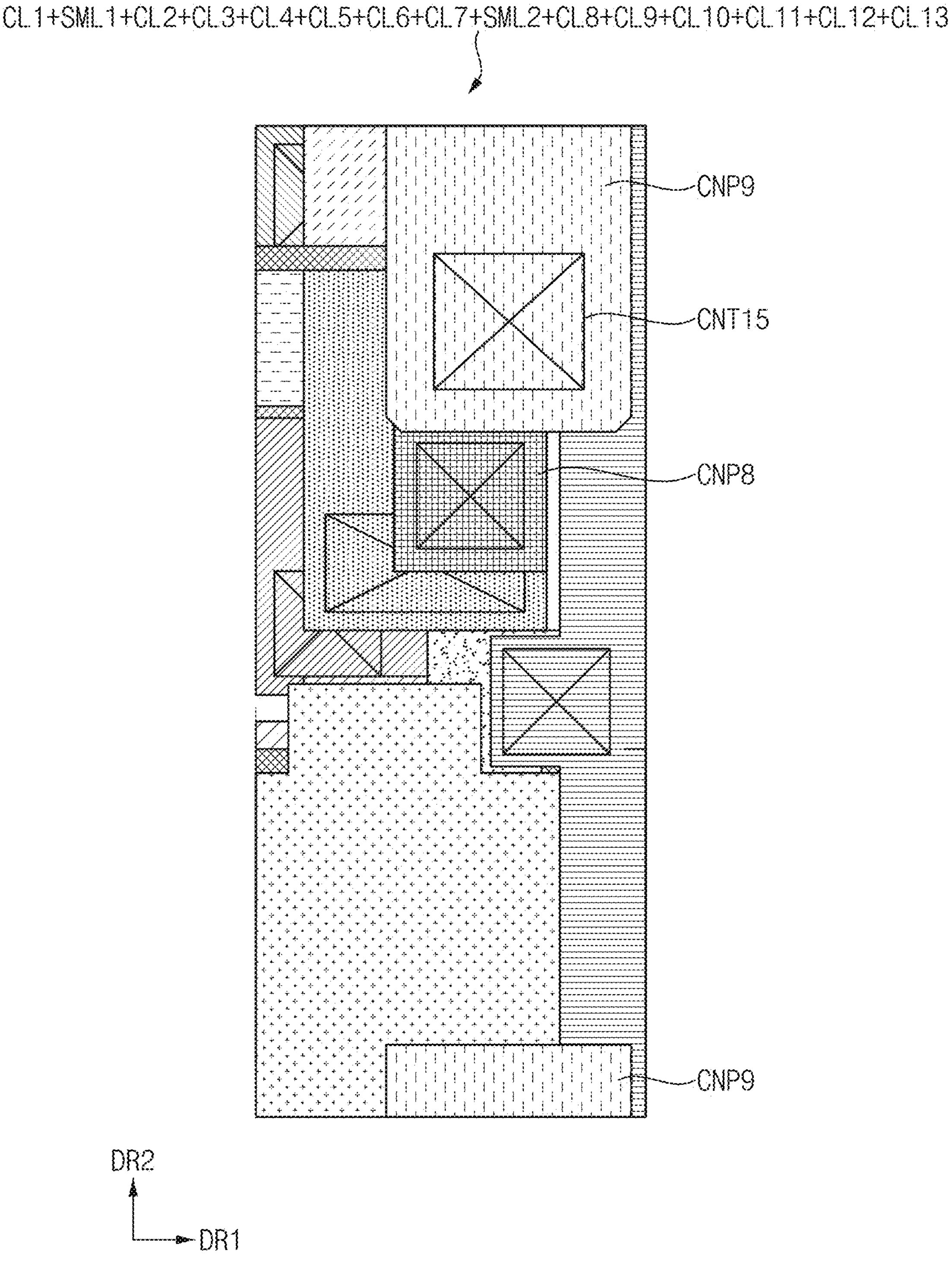

FIG. 31 illustrates the thirteenth conductive layer CL13, and FIG. 32 illustrates the view of FIG. 30 with the thirteenth conductive layer CL13 further arranged.

In an embodiment, as illustrated in FIGS. 3, 31, and 32, the thirteenth conductive layer CL13 may be arranged on the fourteenth insulating layer IL14. The thirteenth conductive layer CL13 may be arranged on the twelfth conductive layer CL12. The thirteenth conductive layer CL13 may include a conductive material. The thirteenth conductive layer CL13 may have a single-layer structure or a multi-layer structure including a plurality of conductive layers. In an embodiment, the thirteenth conductive layer CL13 may be referred to as a fourth source conductive layer.

The thirteenth conductive layer CL13 may include or define a ninth connection pattern CNP9. In an embodiment, as illustrated in FIGS. 30 and 32, the ninth connection pattern CNP9 may overlap the eighth connection pattern CNP8 in a plan view. The ninth connection pattern CNP9 may be connected to the eighth connection pattern CNP8 through a fifteenth contact hole CNT15 defined or formed by penetrating an insulating layer (e.g., the fourteenth insulating layer IL14) arranged therebelow. In an embodiment, for example, the fifteenth contact hole CNT15 may expose a portion of the eighth connection pattern CNP8. A portion of the ninth connection pattern CNP9 may contact the portion of the eighth connection pattern CNP8 exposed by the fifteenth contact hole CNT15.

The fifteenth insulating layer IL15 may be arranged on the thirteenth conductive layer CL13. The fifteenth insulating layer IL15 may include an inorganic insulating material and/or an organic insulating material. The fifteenth insulating layer IL15 may have a single-layer structure or a multi-layer structure including a plurality of insulating layers. The fifteenth insulating layer IL15 may cover the ninth connection pattern CNP9.

As illustrated in FIG. 3, the light emitting element layer LEL may be arranged on the fifteenth insulating layer IL15.

The first electrode E1 of the light emitting element LE may be arranged on the fifteenth insulating layer IL15. The first electrode E1 may include a conductive material. In an embodiment, for example, the first electrode E1 may be the anode of the light emitting element LE.

The first electrode E1 may be connected to the ninth connection pattern CNP9 through a contact hole defined or formed by penetrating an insulating layer (e.g., the fifteenth insulating layer IL15) arranged thereunder. Accordingly, the first electrode E1 may be electrically connected to the fourth drain region D4 of the third semiconductor pattern SMP3 (i.e., the second electrode of the fourth transistor T4) through the ninth connection pattern CNP9, the eighth connection pattern CNP8, and the seventh connection pattern CNP7. In addition, the first electrode E1 may be electrically connected to the first drain region D1 (i.e., the second electrode of the first transistor T1) and the third source region S3 (i.e., the first electrode of the third transistor T3) of the first semiconductor pattern SMP1 through the ninth connection pattern CNP9, the eighth connection pattern CNP8, the seventh connection pattern CNP7, the fifth connection pattern CNP5, the fourth connection pattern CNP4, and the third connection pattern CNP3.

The pixel defining layer PDL may be arranged on the fifteenth insulating layer IL15 and the first electrode E1. The pixel defining layer PDL may cover a peripheral portion of the first electrode E1 and may define a pixel opening that exposes a central portion of the first electrode E1. The pixel defining layer PDL may include an inorganic insulating material and/or an organic insulating material.

A middle layer ML may be arranged on the first electrode E1. In an embodiment, the middle layer ML may be formed or disposed in the pixel opening of the pixel defining layer PDL to correspond to the corresponding first electrode E1. In an embodiment, the middle layer ML may be entirely formed on or disposed to cover the display portion.

The middle layer ML may include an emission layer. In some embodiments, the emission layer may include at least one selected from an organic light emitting material or quantum dot.

In an embodiment, the organic light emitting material may include a low molecular organic compound or a high molecular organic compound. Examples of the low molecular organic compound may include copper phthalocyanine, N,N'-diphenylbenzidine, tris-(8-hydroxyquinoline)aluminum, or the like. Examples of the high molecular organic compound may include poly(3,4-ethylenedioxythiophene), polyaniline, poly-phenylenevinylene, polyfluorene, or the like. These can be used alone or in a combination thereof.

In an embodiment, the quantum dot may include a core including a Group II-VI compound, a Group III-V compound, a Group IV-VI compound, a Group IV element, and/or a Group IV compound. In an embodiment, the quantum dot may have a core-shell structure including the core and a shell surrounding the core. The shell may serve as a protection layer for preventing the core from being chemically denatured to maintain semiconductor characteristics, and may serve as a charging layer for imparting electrophoretic characteristics to the quantum dot.

In an embodiment, the middle layer ML may further include various functional layers, such as a hole injection layer, a hole transport layer, an electron transport layer, an electron injection layer, or the like, arranged on and/or below the emission layer.

The second electrode E2 of the light emitting element LE may be arranged on the middle layer ML. The second electrode E2 may also be arranged on the pixel defining layer PDL. The second electrode E2 may include a conductive material. In an embodiment, for example, the second electrode E2 may be the cathode of the light emitting element LE. The first electrode E1, the middle layer ML, and the second electrode E2 may form or collectively define the light emitting element LE.

According to embodiments, a degree of integration of the pixel circuits PC included in the display panel DP may be further improved. Accordingly, a resolution of the display device DD may be further improved. In an embodiment, for example, the resolution of the display device DD may be about 1500 pixels per inch (ppi) or higher.

The display device DD according to embodiments described above may be applied to various electronic devices.

Figure 33:
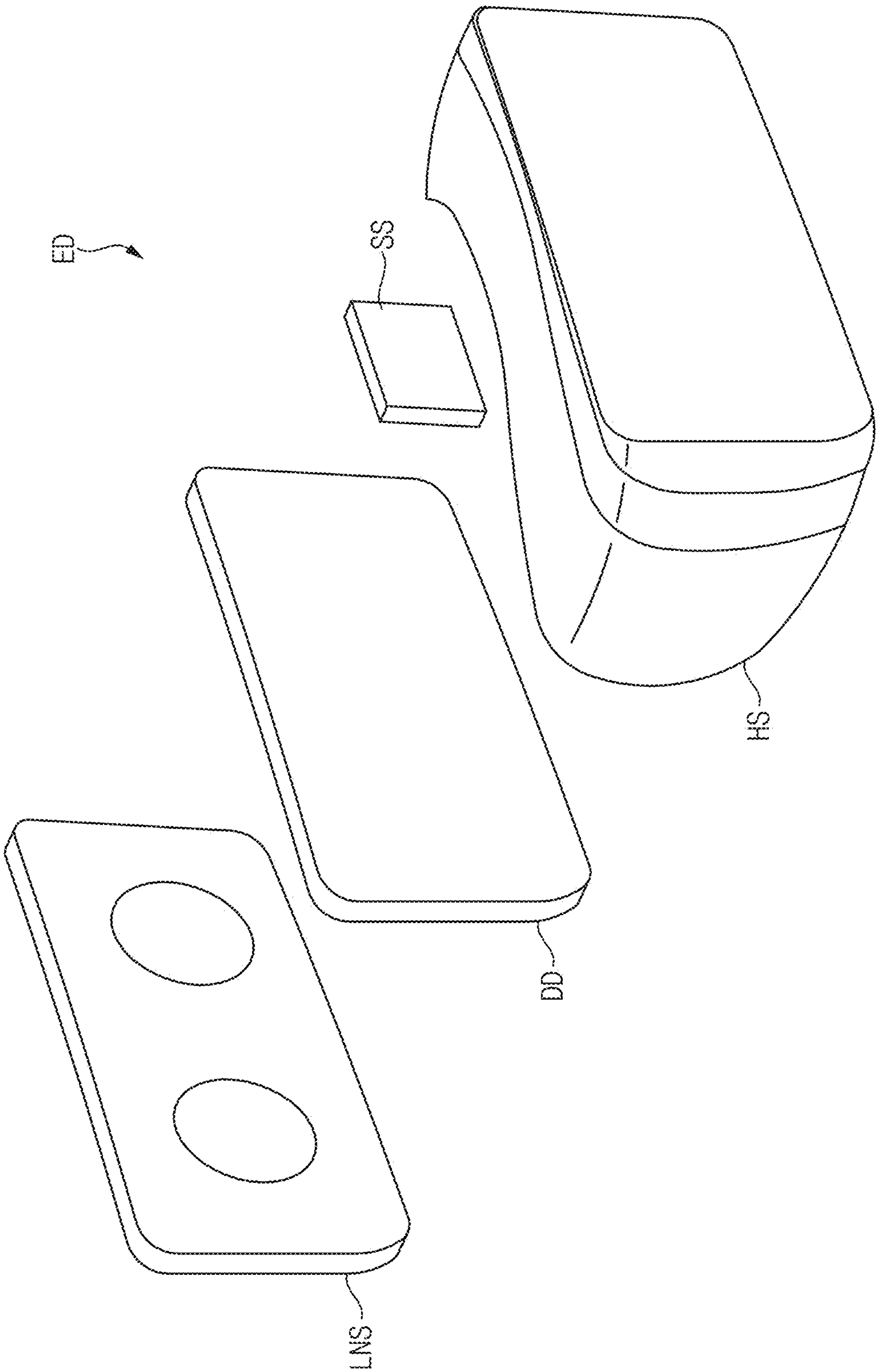
FIG. 33 is an exploded perspective view illustrating an electronic device according to an embodiment.

FIG. 33 is an exploded perspective view illustrating an electronic device according to an embodiment.

Referring to FIG. 33, an electronic device ED according to an embodiment may include a lens LNS, a display device DD, a sensor SS, and a housing HS. In an embodiment, the electronic device ED may be an electronic device for virtual reality (VR) worn on a user's head. The display device DD may correspond to an embodiment of the display device DD described above with reference to FIGS. 1 to 32. That is, an embodiment of the display device DD described with reference to FIGS. 1 to 32 may be implemented as a head-mounted display device and may display a VR image, but embodiments are not limited thereto.

In an embodiment, the sensor SS may include a camera, but embodiments are not limited thereto, and the sensor SS may include various types of sensors for tracking a user's sight. The display device DD may be adjacent to the lens LNS. The housing HS may accommodate the lens LNS, the display device DD, and the sensor SS. FIG. 33 illustrates an embodiment where the lens LNS, the display device DD, and the sensor SS are accommodated on one side of the housing HS, but embodiments are not limited thereto. In an embodiment, the electronic device ED may further include a strap for being worn on the user's head, a cushion for improving a comfort of the user, or the like.

Figure 34:
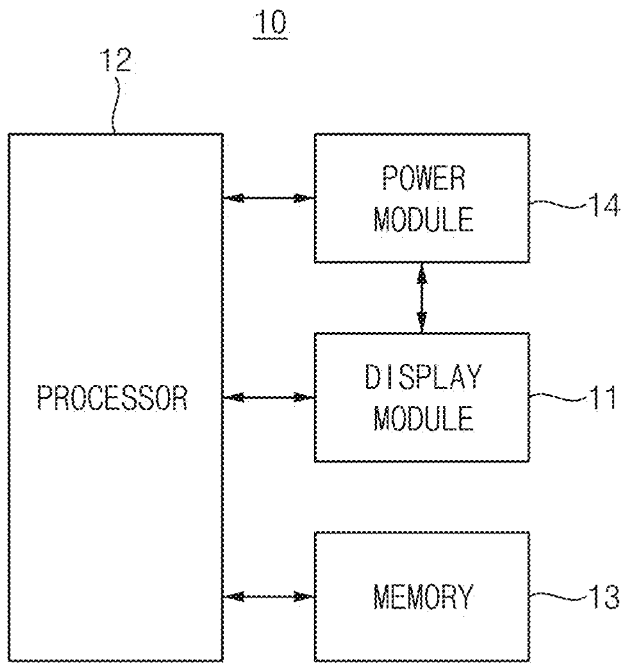
FIG. 34 is a block diagram illustrating an electronic device according to an embodiment.

FIG. 34 is a block diagram illustrating an electronic device according to an embodiment.

Referring to FIG. 34, an embodiment of an electronic device 10 may include a display module 11, a processor 12, a memory 13, and a power module 14.

In an embodiment, the electronic device 10 may include the display device DD of FIG. 1. The electronic device 10 may further include modules or devices with additional functions other than the display device.

The processor 12 may include at least one selected from a central processing unit ("CPU"), an application processor ("AP"), a graphic processing unit ("GPU"), a communication processor ("CP"), an image signal processor ("ISP"), and a controller.

In an embodiment, the processor 12 may provide an input image data (IMG of FIG. 1) and/or an input control signal (CONT of FIG. 1) to the display device.

The memory 13 may store data information to be used for the operation of the processor 12 or the display module 11. When the processor 12 executes the application stored in the memory 13, an image data signal and/or an input control signal may be transmitted to the display module 11, and the display module 11 may process the received signal and output image information through a display screen.

The power module 14 may include a power supply module, such as a power adapter or a battery device, and a power conversion module which converts the power supplied by the power supply module to generate power required for the operation of the electronic device 10.

At least one of components of the electronic device 10 described above may be included in the display device according to embodiments described above. In addition, some of the individual modules functionally included in one module may be included in the display device, and other portions may be provided separately from the display device. In an embodiment, for example, the display device may include the display module 11. The processor 12, the memory 13, and the power module 14 may be provided in the form of other devices within the electronic device 10 other than the display device.

Figure 35:
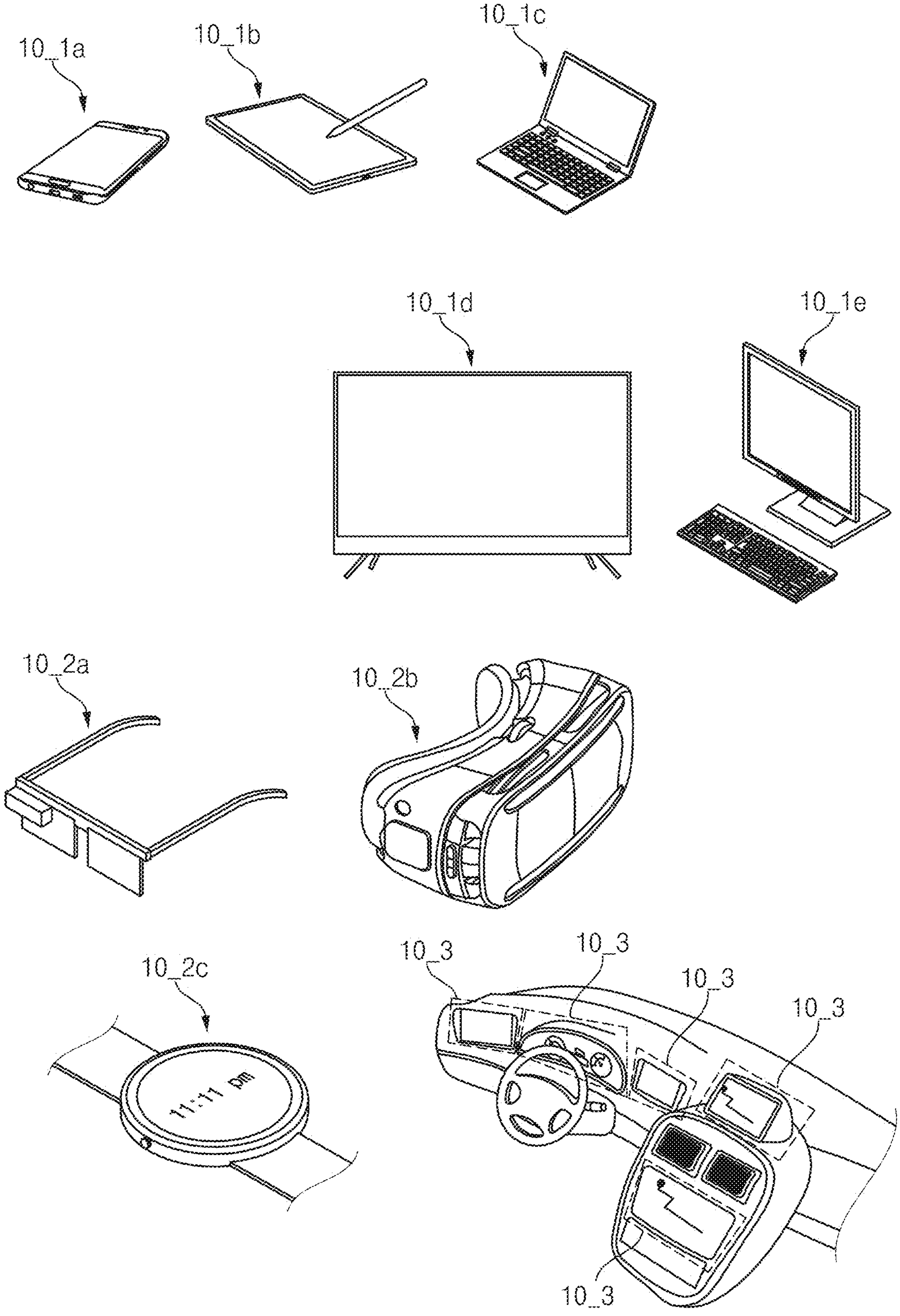
FIG. 35 is a schematic diagram illustrating electronic devices according to various embodiments.

FIG. 35 is a schematic diagram illustrating electronic devices according to various embodiments.

Referring to FIGS. 34 and 35, various electronic devices 10 to which the display device according to the embodiments may be applied may include not only image display electronic devices, such as a smartphone **10_1*a*, a tablet PC 10_1*b*, a laptop 10_1*c*, a TV 10_1*d*, and a desktop monitor 10_1*e*, but also wearable electronic devices including display modules, such as smart glasses 10_2*a*, a head-mounted display 10_2*b*, and a smart watch 10_2*c*, automotive electronic devices 10_3** including display modules, such as a dashboard of a car, a center fascia, a Center Information Display ("CID") disposed on a dashboard, and a room mirror display, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a light emitting element;

a first transistor which applies a driving current to the light emitting element;

a first capacitor including a first electrode electrically connected to a gate electrode of the first transistor and a second electrode;

a second transistor which applies a data voltage to the second electrode of the first capacitor in response to a write gate signal;

a third transistor which diode-connects the first transistor in response to a compensation gate signal; and a fourth transistor which applies an initialization voltage to an anode of the light emitting element in response to an initialization gate signal, wherein a channel of the first transistor and a channel of the third transistor are in a first semiconductor layer, and wherein a channel of the second transistor and a channel of the fourth transistor are in a second semiconductor layer arranged on the first semiconductor layer.

2. The display device of claim 1, wherein the first semiconductor layer includes a silicon semiconductor, and wherein the second semiconductor layer includes an oxide semiconductor.

3. The display device of claim 1, wherein the first semiconductor layer includes a first semiconductor pattern including a first source region, a first drain region, a first channel region between the first source region and the first drain region, a third source region connected to the first drain region, a third drain region, and a third channel region between the third source region and the third drain region, and wherein the first channel region is the channel of the first transistor, and the third channel region is the channel of the third transistor.

4. The display device of claim 1, wherein the second semiconductor layer includes:

a second semiconductor pattern including a second source region, a second drain region, and a second channel region between the second source region and the second drain region; and a third semiconductor pattern spaced apart from the second semiconductor pattern and including a fourth source region, a fourth drain region, and a fourth channel region between the fourth source region and the fourth drain region, and wherein the second channel region is the channel of the second transistor, and the fourth channel region is the channel of the fourth transistor.

5. The display device of claim 1, wherein the first capacitor at least partially overlaps each of the channel of the second transistor and the channel of the third transistor in a plan view.

6. The display device of claim 1, further comprising:

a second capacitor including a first electrode electrically connected to the second transistor and the second electrode of the first capacitor and a second electrode which receives the initialization voltage.

7. The display device of claim 6, wherein the second capacitor at least partially overlaps the first capacitor in a plan view.

8. The display device of claim 6, wherein the second capacitor at least partially overlaps each of the channel of the second transistor and the channel of the third transistor in a plan view.

9. The display device of claim 8, wherein the first capacitor is arranged between the first semiconductor layer and the second semiconductor layer, and wherein the second capacitor is arranged on the second semiconductor layer.

10. The display device of claim 6, wherein the first transistor includes the gate electrode, a first electrode which receives a power voltage, and a second electrode electrically connected to the light emitting element, wherein the display device further comprises a power line which applies the power voltage to the first electrode of the first transistor, and wherein the power supply line is in a first conductive layer arranged below the first semiconductor layer.

11. The display device of claim 10, wherein the third transistor includes a gate electrode which receives the compensation gate signal, a first electrode electrically connected to the second electrode of the first transistor, and a second electrode electrically connected to the gate electrode of the first transistor, wherein the display device further comprises a first connection pattern electrically connected to the first electrode of the first transistor and the power line, wherein the gate electrode of the first transistor and the gate electrode of the third transistor are in a second conductive layer arranged between the first semiconductor layer and the second semiconductor layer, and wherein the first connection pattern is in a third conductive layer arranged between the second conductive layer and the second semiconductor layer.

12. The display device of claim 11, further comprising:

a second connection pattern electrically connected to the gate electrode of the first transistor and the second electrode of the third transistor, and wherein the second connection pattern is in the third conductive layer.

13. The display device of claim 11, further comprising:

a third connection pattern electrically connected to the second electrode of the first transistor and the first electrode of the third transistor, and wherein the third connection pattern is in a fourth conductive layer arranged between the third conductive layer and the second semiconductor layer.

14. The display device of claim 11, wherein the first electrode of the first capacitor is electrically connected to the second electrode of the third transistor, and the first electrode of the first capacitor is in a fifth conductive layer arranged between the third conductive layer and the second semiconductor layer.

15. The display device of claim 14, further comprising:

a fourth connection pattern electrically connected to the second electrode of the first transistor and the first electrode of the third transistor, and wherein the fourth connection pattern is in the fifth conductive layer.

16. The display device of claim 14, wherein the second transistor includes a gate electrode which receives the write gate signal, a first electrode which receives the data voltage, and a second electrode electrically connected to the second electrode of the first capacitor, and wherein the second electrode of the first capacitor is electrically connected to the second electrode of the second transistor and the first electrode of the second capacitor, and the second electrode of the first capacitor is in a sixth conductive layer arranged between the fifth conductive layer and the second semiconductor layer.

17. The display device of claim 16, further comprising:

a fifth connection pattern electrically connected to the second electrode of the first transistor and the first electrode of the third transistor; and a sixth connection pattern electrically connected to the second electrode of the first capacitor, and wherein the fifth connection pattern and the sixth connection pattern are in a seventh conductive layer arranged between the sixth conductive layer and the second semiconductor layer.

18. The display device of claim 16, wherein the fourth transistor includes a gate electrode which receives the initialization gate signal, a first electrode which receives the initialization voltage, and a second electrode electrically connected to the light emitting element, wherein the gate electrode of the second transistor and the gate electrode of the fourth transistor are in an eighth conductive layer arranged on the second semiconductor layer, and wherein the first electrode of the second capacitor is electrically connected to the second electrode of the second transistor and the second electrode of the first capacitor, and the first electrode of the second capacitor is in a ninth conductive layer arranged on the eighth conductive layer.

19. The display device of claim 18, further comprising:

a seventh connection pattern electrically connected to the second electrode of the first transistor and the first electrode of the third transistor, and wherein the seventh connection pattern is in the ninth conductive layer.

20. An electronic device comprising:

a housing; and a display device accommodated in the housing, wherein the display device displays an image, wherein the display device includes:

a light emitting element;

a first transistor which applies a driving current to the light emitting element;

a first capacitor including a first electrode electrically connected to a gate electrode of the first transistor and a second electrode;

a second transistor which applies a data voltage to the second electrode of the first capacitor in response to a write gate signal;

a third transistor which diode-connects the first transistor in response to a compensation gate signal; and a fourth transistor which applies an initialization voltage to an anode of the light emitting element in response to an initialization gate signal, wherein a channel of the first transistor and a channel of the third transistor are in a first semiconductor layer, and wherein a channel of the second transistor and a channel of the fourth transistor are in a second semiconductor layer arranged on the first semiconductor layer.

* * * * *